US012656379B2

(12) United States Patent
Soliman et al.

(10) Patent No.: US 12,656,379 B2
(45) Date of Patent: Jun. 16, 2026

(54) DEVICE FOR RECEIVING AN INPUT CURRENT AND OPERATING METHOD THEREFOR

(71) Applicant: Robert Bosch GmbH, Stuttgart (DE)

(72) Inventors: Taha Soliman, Renningen (DE); Tobias Kirchner, Ludwigsburg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 164 days.

(21) Appl. No.: 18/690,839

(22) PCT Filed: Aug. 24, 2022

(86) PCT No.: PCT/EP2022/073535
§ 371 (c)(1),
(2) Date: Mar. 11, 2024

(87) PCT Pub. No.: WO2023/036609
PCT Pub. Date: Mar. 16, 2023

(65) Prior Publication Data
US 2024/0402226 A1 Dec. 5, 2024

(30) Foreign Application Priority Data

Sep. 13, 2021 (DE) ..................... 10 2021 210 057.0

(51) Int. Cl.
*G01R 19/165* (2006.01)
*H03M 1/12* (2006.01)
(52) U.S. Cl.
CPC ...... *G01R 19/16571* (2013.01); *H03M 1/129* (2013.01)

(58) Field of Classification Search
CPC .......... H03M 1/42; H03M 1/46; H03M 1/124; H03M 1/125; H03M 1/129
See application file for complete search history.

(56) References Cited

U.S. PATENT DOCUMENTS

| | | | | |
|---|---|---|---|---|
| 5,805,097 A * | 9/1998 | Yung | ....................... | H03M 1/46 |
| | | | | 341/161 |
| 6,150,967 A * | 11/2000 | Nakamura | ......... | G01R 19/2509 |
| | | | | 341/135 |
| 7,332,952 B2 | 2/2008 | McLeod et al. | | |
| 7,414,562 B2 * | 8/2008 | Kok | ..................... | H03M 1/125 |
| | | | | 341/161 |
| 9,692,440 B1 | 6/2017 | Onishi | | |

(Continued)

FOREIGN PATENT DOCUMENTS

| | | |
|---|---|---|
| DE | 102014117444 A1 | 5/2015 |
| DE | 102014014690 A1 | 4/2016 |

OTHER PUBLICATIONS

International Search Report for PCT/EP2022/073535, Issued Dec. 20, 2022.

(Continued)

*Primary Examiner* — Lam T Mai
(74) *Attorney, Agent, or Firm* — NORTON ROSE FULBRIGHT US LLP

(57) ABSTRACT

A device including a first input for receiving an input current, a second input for receiving a reference current, and a first output. The device is designed to compare the input current with the reference current and, on the basis of the comparison, to output an output current.

17 Claims, 12 Drawing Sheets

(56) References Cited

U.S. PATENT DOCUMENTS

| | | | | | |
|---|---|---|---|---|---|
| 9,954,433 | B2 * | 4/2018 | Venturini | | H02P 27/06 |
| 10,002,509 | B2 * | 6/2018 | Savage, Jr. | | F21V 5/041 |
| 10,027,225 | B2 * | 7/2018 | Yu | | H02M 3/156 |
| 10,128,866 | B2 * | 11/2018 | Tkachev | | H04N 23/54 |
| 10,191,503 | B2 * | 1/2019 | Ogura | | G05F 1/468 |
| 10,239,408 | B2 * | 3/2019 | Chun | | H02M 3/3376 |
| 10,319,307 | B2 * | 6/2019 | Chaji | | G09G 3/3291 |
| 10,491,107 | B2 * | 11/2019 | Poon | | H03K 7/08 |
| 10,797,720 | B2 * | 10/2020 | Sung | | H03M 1/785 |
| 10,804,921 | B1 | 10/2020 | Far | | |
| 10,812,097 | B1 * | 10/2020 | Milicevic | | H03M 1/36 |
| 10,818,234 | B2 * | 10/2020 | Song | | G09G 3/3233 |
| 10,879,832 | B2 * | 12/2020 | Sangsefidi | | B60L 50/61 |
| 11,081,062 | B2 * | 8/2021 | Kim | | G09G 3/3283 |
| 11,190,202 | B2 * | 11/2021 | Moon | | H03M 1/0695 |
| 11,923,762 | B2 * | 3/2024 | Sethumadhavan | ... | H02M 3/158 |
| 2004/0080446 | A1 | 4/2004 | Chen et al. | | |
| 2009/0160533 | A1 * | 6/2009 | Lee | | G11C 5/145 |
| | | | | | 327/536 |
| 2010/0117876 | A1 | 5/2010 | Cao et al. | | |
| 2015/0249464 | A1 | 9/2015 | Cohen et al. | | |
| 2016/0070279 | A1 | 3/2016 | Heiling | | |
| 2016/0334817 | A1 * | 11/2016 | Takano | | G05F 1/468 |
| 2017/0093399 | A1 * | 3/2017 | Atkinson | | H03K 19/0016 |
| 2018/0166133 | A1 * | 6/2018 | Buchanan | | G11C 13/004 |
| 2020/0357452 | A1 * | 11/2020 | Wang | | G11C 11/1673 |
| 2021/0250033 | A1 | 8/2021 | Huynh | | |
| 2024/0120930 | A1 * | 4/2024 | Soliman | | H03M 1/0607 |

OTHER PUBLICATIONS

Xiao et al. "A 0.8 μW 8-Bit 1.5 ~20-pF-Input-Range Capacitance-to-Digital Converter for Lab-on-Chip Digital Microfluidics Systems" Biomedical Circuits and Systems Conference (BIOCAS), IEEE, 2012, pp. 384-387.
Van Der Plas et al. "A 150MS/s 133 μ4W 7b ADC In 90nm Digital CMOS Using a Comparator-Based Asynchronous Binary-Search Sub-ADC" Solid-State Circuits Conference, ISSCC 2008, Digest of Technical Papers, IEEE International, 2008, pp. 242-243 and 610.

* cited by examiner

300 convert current into binary value ----302 perform binary encoding ----304 reduce a magnitude of a current ----306 provide completely current driven A/D converter ----308

DEVICE FOR RECEIVING AN INPUT CURRENT AND OPERATING METHOD THEREFOR

FIELD

The present invention relates to a device comprising a first input for receiving an input current.

The present invention further relates to a method for operating a device comprising a first input for receiving an input current.

SUMMARY

Exemplary embodiments of the present invention relate to a device comprising a first input for receiving an input current, a second input for receiving a reference current, and a first output, wherein the device is designed to compare the input current with the reference current and, on the basis of the comparison, to output an output current at the first output.

In further exemplary embodiments of the present invention, an electrical current can, for example, be evaluated in relation to the reference current. In further exemplary embodiments, using a plurality of devices according to the embodiments and possibly different reference currents, an input current can, for example, be efficiently transformed into a digital, for example binary, quantity. In further exemplary embodiments, a current-based analog-to-digital converter can, for example, be provided by means of a plurality of devices according to the embodiments.

In further exemplary embodiments of the present invention, the comparison of the input current with the reference current can also be performed using, for example, a voltage characterizing the reference current.

In further exemplary embodiments of the present invention, it is provided that the device is designed to ascertain whether the input current is less than the reference current, and, if the input current is less than the reference current, to output an output current which corresponds to the input current, for example to output the input current as the output current.

In further exemplary embodiments of the present invention, it is provided that the device is designed, if the input current is greater than the reference current, for example greater than or equal to the reference current, to output an output current which corresponds to a difference between the input current and the reference current. As a result, in further exemplary embodiments, a possibly subsequent stage, for example comprising at least one (further) device according to the embodiments, can operate with a correspondingly smaller current, which can, for example, reduce an electrical power loss in the subsequent stage.

In further exemplary embodiments of the present invention, it is provided that the device is designed to ascertain whether the input current is less than a predeterminable, for example integer, n-fold of the reference current, and, if the input current is less than the predeterminable, for example integer, n-fold of the reference current, to output an output current which corresponds to an nth of the input current. For example, n is a natural number greater than one. As a result, an electrical power loss can be further reduced in further exemplary embodiments.

In further exemplary embodiments of the present invention, it is provided that the device is designed, if the input current is greater than n times the reference current, for example greater than or equal to n times the reference current, to output an output current which corresponds to an nth of a difference between the input current and the reference current. As a result, an electrical power loss can be further reduced in further exemplary embodiments.

In further exemplary embodiments of the present invention, it is provided that the device has a second output, wherein the device is designed to output an output signal at the second output on the basis of the comparison, wherein, for example, the output signal is a binary signal. Thus, the result of the comparison can be signaled efficiently in further exemplary embodiments. In further exemplary embodiments, the output signals output via the respective second output of different devices can, for example, form a binary value, wherein, for example, each of the different devices is associated with a different significance of the binary value.

In further exemplary embodiments of the present invention, it is provided that the device is designed to amplify the output current, for example to double it. In further exemplary embodiments, this can be used, for example, to increase precision, for example when using a plurality of devices connected in series according to further exemplary embodiments.

In further exemplary embodiments of the present invention, it can be provided that the device has at least one of the following elements: a) a conversion device, which is designed to generate a bias voltage, for example control voltage, on the basis of a reference current, for example for a comparator device, b) a comparator device, which is designed to compare the input current with the reference current and/or to compare a quantity characterizing the input current with a quantity characterizing the reference current, wherein, for example, the comparator device is designed to output an output signal on the basis of the comparison, c) a current discharge device, which is designed to discharge a current at least temporarily, for example at least temporarily to a first reference potential, for example a ground potential, d) an inverter device, which is designed to invert an, or the, output signal at least once, e) a first current output device, which is designed to output a first current at the first output at least temporarily, for example if the input current is less than the reference current, f) a second current output device, which is designed to output a second current at the first output at least temporarily, for example if the input current is greater than the reference current.

In further exemplary embodiments of the present invention, the conversion device can, for example, have: at least one transistor (or a semiconductor structural element with controllable resistance) or a series circuit of at least two transistors. In further exemplary embodiments, the at least one transistor is, for example, a MOSFET, metal-oxide semiconductor field-effect transistor, for example an N-channel MOSFET.

In further exemplary embodiments of the present invention, the conversion device can have at least one further transistor, for example in series with the aforementioned transistor(s), as a result of which it is possible in further exemplary embodiments to compensate, for example, for a voltage drop at at least one further component of the device.

In further exemplary embodiments of the present invention, the conversion device can have at least one resistor or a diode, for example Schottky diode, for example in series with the aforementioned transistor(s), as a result of which, in further exemplary embodiments, a voltage difference ("off-set") can, for example, be generated between bias voltages that can be generated by means of the conversion device, for example on the basis of the reference current, for example for a, or the, comparator device.

In further exemplary embodiments of the present invention, the comparator device can have at least one transistor or a series circuit of at least two transistors, for example MOSFETs, which can be controlled, for example, by means of the bias voltage(s), which can be generated, for example, by the conversion device.

In further exemplary embodiments of the present invention, the comparator device can have at least one further transistor, for example in series with the aforementioned transistor(s), as a result of which it is possible in further exemplary embodiments to compensate, for example, for a voltage drop at at least one further component of the device.

In further exemplary embodiments of the present invention, the comparator device can have at least one further transistor, for example in series with the aforementioned transistor(s), wherein the at least one further transistor is, for example, part of a current mirror circuit, for example in order to copy a current flowing through the comparator device, for example the input current, for example for a further component of the device.

In further exemplary embodiments of the present invention, the current discharge device can have at least one transistor, for example MOSFET, which at least temporarily discharges a current, for example from the comparator device. In further exemplary embodiments, the current discharge device can have at least one further transistor, for example MOSFET, which is, for example, part of a current mirror circuit, for example in order to copy a current flowing through the current discharge device, for example the current discharged from the comparator device, for example for a further component of the device.

In further exemplary embodiments of the present invention, the inverter device can have at least one series circuit of two transistors, for example MOSFETs, for example two MOSFETs for one inverter stage. In further exemplary embodiments, the inverter device can also have a plurality of inverter stages.

In further exemplary embodiments of the present invention, the first current output device can have a first transistor, for example MOSFET, which is part of a current mirror circuit, which mirrors, for example, a current of the comparator device into the first current output device. In further exemplary embodiments, the first current output device can have a second transistor, for example MOSFET, which is connected, for example, in parallel with the first transistor of the first current output device, and which also mirrors the current of the comparator device into the first current output device, as a result of which the current mirrored into the first current output device can be doubled, for example. In further exemplary embodiments, the first current output device can have a third transistor, for example MOSFET, which selectively activates or deactivates the first current output device, for example on the basis of the output signal.

In further exemplary embodiments of the present invention, the second current output device can have a transistor, for example MOSFET, which is part of a current mirror circuit, which mirrors, for example, a current of the current discharge device into the second current output device. In further exemplary embodiments, the second current output device can have a second transistor, for example MOSFET, which is connected, for example, in parallel with the first transistor of the second current output device, and which also mirrors the current of the current discharge device into the second current output device, as a result of which the current mirrored into the second current output device can be doubled, for example.

In further exemplary embodiments of the present invention, it is provided that the device has a first polarity configuration, wherein, for example, the device of the first polarity configuration is designed to receive an input current flowing from a first reference potential, for example a ground potential, and to output the output current to the first reference potential, for example ground potential.

In further exemplary embodiments of the present invention, it is provided that the device has a second polarity configuration, wherein, for example, the device of the second polarity configuration is designed to receive an input current flowing from a second reference potential, which is different, for example, from a, or the, first reference potential, for example an operating voltage potential associated with an operating voltage, and to output the output current to the second reference potential, for example operating voltage potential.

Further exemplary embodiments of the present invention relate to an analog-to-digital converter device comprising i, $i>1$, devices according to the embodiments, wherein the i devices are in each case connectable in series and/or connected in series with respect to their first input and their first output in a series circuit such that a first output of a j-th device of the series circuit is connected to a first input of a j+1-th device of the series circuit, with j=1, 2, to i−1. In other words, an output current of a device preceding in the series circuit can be fed as an input current to a device following in the series circuit.

In further exemplary embodiments of the present invention, it is provided that each of the i devices can be fed in each case with a reference current, wherein, for example, an identical or a different reference current can be fed to at least some of the i devices.

In further exemplary embodiments of the present invention, it is provided that each of the i devices can be fed in each case with a reference current which corresponds to a position of the respective device in the series circuit, wherein, for example, a magnitude of the reference currents for adjacent devices in the series circuit differs by a predeterminable factor, for example by two. As a result, a binary analog-to-digital converter can be efficiently provided, for example.

In further exemplary embodiments of the present invention, it is provided that at least two successive devices in the series circuit in each case have a different polarity configuration, wherein, for example, a plurality of, for example all, successive devices in the series circuit in each case have an alternating polarity configuration, wherein, for example, the respective polarity configuration corresponds to a position of the respective device in the series circuit. In further exemplary embodiments, this can help reduce a complexity of the individual devices and an electrical power consumption.

Further exemplary embodiments of the present invention relate to a method for operating a device comprising a first input for receiving an input current, a second input for receiving a reference current, and a first output, wherein the method comprises: comparing the input current with the reference current; and outputting an output current at the first output on the basis of the comparison.

In further exemplary embodiments of the present invention, the device is provided with a second output, wherein the method further comprises: outputting, on the basis of the comparison, an output signal at the second output, wherein, for example, the output signal is a binary signal.

Further exemplary embodiments of the present invention relate to a method for operating an analog-to-digital converter device comprising i, $i>1$, devices according to the embodiments, wherein the i devices are in each case connectable in series and/or connected in series with respect to their first input and their first output in a series circuit such that a first output of a j-th device of the series circuit is connected to a first input of a j+1-th device of the series circuit, with j=1, 2, to i−1. For example, the method is designed to operate an analog-to-digital converter device according to the embodiments. The method comprises: feeding an input signal, for example in the form of an input current for a first device of the series circuit; providing a digital value, for example binary value, characterizing the input signal, for example the input current, on the basis of an output current and/or an output signal of at least one, for example a plurality of, for example all, the i devices.

Further exemplary embodiments of the present invention relate to a computing device, for example for ascertaining a scalar product, for example a vector matrix multiplier, for example a dot product engine, comprising a matrix of elements with a controllable electrical resistance (for example, memristors or ferroelectric field-effect transistors), and at least one analog-to-digital converter device according to the embodiments. For example, the at least one analog-to-digital converter device can be used according to exemplary embodiments for current measurement with respect to at least one column of the matrix, in particular on a high side, i.e., in the range of a comparatively large electrical potential, for example of an operating voltage potential different from a ground potential.

Further exemplary embodiments of the present invention relate to a use of the device according to the embodiments and/or the analog-to-digital converter device according to the embodiments and/or the method according to the embodiments and/or the computing device according to the embodiments for at least one of the following elements: a) converting a current into a binary value, b) performing binary encoding, c) reducing a magnitude of at least one current derivable on the basis of the input current, d) providing a, for example completely, current-driven analog-to-digital converter.

Further features, possible applications, and advantages of the present invention will be apparent from the following description of exemplary embodiments of the present invention shown in the figures. In this case, all of the features described or shown form the subject matter of the present invention individually or in any combination, irrespective of their wording or representation in the description or in the figures.

DETAILED DESCRIPTION OF EXAMPLE EMBODIMENTS

Figure 1:
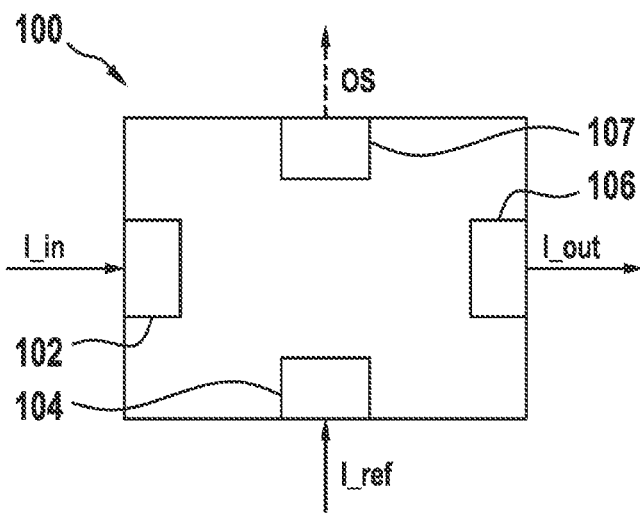
FIG. 1 schematically shows a simplified block diagram according to exemplary embodiments of the present invention.
Figure 2:
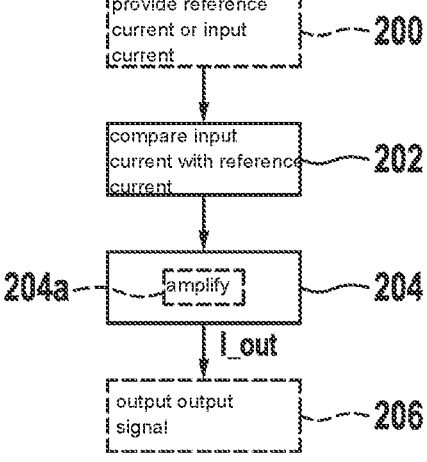
FIG. 2 schematically shows a simplified flowchart according to exemplary embodiments of the present invention.

Exemplary embodiments, FIGS. 1, 2, relate to a device 100 comprising a first input 102 for receiving an input current I_in, a second input 104 for receiving a reference current I_ref, and a first output 106, wherein the device 100 is designed to compare 202 the input current I_in with the reference current I_ref (FIG. 2) and, on the basis of the comparison 202, to output an output current I_out at the first output 106.

In further exemplary embodiments, an electrical current I_in can, for example, be evaluated in relation to the reference current I_ref. In further exemplary embodiments, using a plurality of devices 100 (FIG. 1) according to the embodiments and possibly different reference currents I_ref, the input current I_in can, for example, be efficiently transformed into a digital, for example binary, quantity. In further exemplary embodiments, a current-based analog-to-digital converter can, for example, be provided by means of a plurality of devices 100 according to the embodiments, see below with respect to FIGS. 6, 7, 10, for example.

In further exemplary embodiments, FIG. 2, an optional block 200 can be provided, the purpose of which is, for example, to provide the reference current I_ref and/or to provide the input current I_in.

In further exemplary embodiments, it is provided that the device 100 has a second output 107 (FIG. 1), wherein the device 100 is designed to output 206 an output signal OS (FIG. 1) at the second output 107 on the basis of the comparison 202 (FIG. 2), wherein, for example, the output signal OS is a binary signal (FIG. 2). Thus, the result of the comparison 202 can be signaled efficiently in further exemplary embodiments.

In further exemplary embodiments, the output signals OS output via the respective second output 107 of different devices 100 can, for example, form a binary value, wherein, for example, each of the different devices is associated with a different significance of the binary value.

Figure 3:
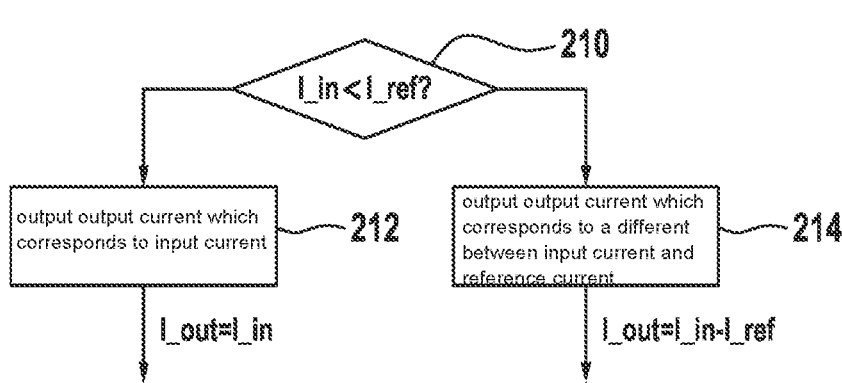
FIG. 3 schematically shows a simplified flowchart according to exemplary embodiments of the present invention.

In further exemplary embodiments, FIG. 3, it is provided that the device 100 is designed to ascertain 210 whether the input current I_in is less than the reference current I_ref, and, if the input current I_in is less than the reference current I_ref, to output 212 an output current I_out which corresponds to the input current I_in, for example to output the input current I_in as the output current I_out.

In further exemplary embodiments, it is provided that the device 100 is designed, if the input current I_in is greater than the reference current I_ref, for example greater than or equal to the reference current I_ref, to output 214 an output current I_out which corresponds to a difference between the input current I_in and the reference current I_ref. As a result, in further exemplary embodiments, a possibly subsequent stage (not shown in FIG. 3), for example comprising at least one (further) device 100 according to the embodiments, can operate with a correspondingly smaller current, which can, for example, reduce an electrical power loss in the subsequent stage.

Figure 4:
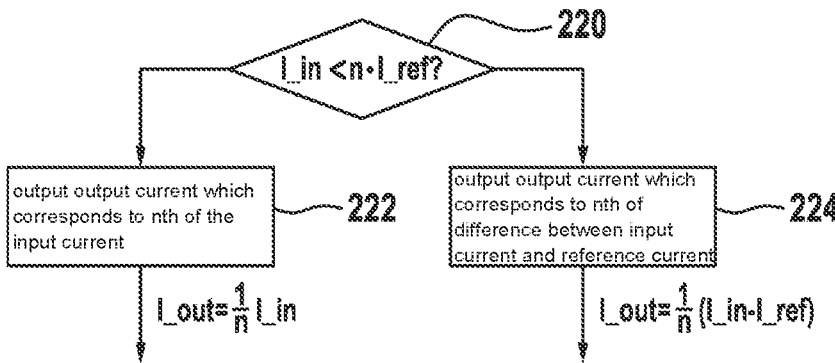
FIG. 4 schematically shows a simplified flowchart according to exemplary embodiments of the present invention.

In further exemplary embodiments, FIG. 4, it is provided that the device 100 (FIG. 1) is designed to ascertain 220 whether the input current I_in is less than a predeterminable, for example integer, n-fold of the reference current I_ref, and, if the input current I_in is less than the predeterminable, for example integer, n-fold of the reference current I_ref, to output an output current I_out 222 which corresponds to an nth of the input current I_in. For example, n is a natural number greater than one. As a result, an electrical power loss can be further reduced in further exemplary embodiments. When using further, for example downstream, devices that can process the output current I_out, their reference currents can, for example, be adapted to the output current currently output according to block 222.

In further exemplary embodiments, FIG. 4, it is provided that the device 100 (FIG. 1) is designed, if the input current I_in is greater than n times the reference current I_ref, for example greater than or equal to n times the reference current I_ref, to output 224 an output current I_out which corresponds to an nth of a difference between the input current I_in and the reference current I_ref. As a result, an electrical power loss can be further reduced in further exemplary embodiments.

In further exemplary embodiments, it is provided that the device 100 (FIG. 1) is designed to compare the input current I_in with the reference current I_ref and, on the basis of the comparison, to output a fraction or a multiple of the input current I_in or the reference current I_ref as the output current I_out. In other words, in this case, the exemplary block 220 according to FIG. 4 can comprise a comparison of the input current I_in with the reference current I_ref, for example comparable to block 210 according to FIG. 3.

In further exemplary embodiments, the comparison can be performed, for example, by means of a current mirror device with which, for example, a reference source and a comparison path are provided. Details in this respect are described below, for example with reference to FIGS. 12, 13.

In further exemplary embodiments, it can be provided, for example, to multiply the reference source by 1/n, wherein this can be compensated in further exemplary embodiments, for example, by means of an n-fold gate width of a transistor in the comparison path, for example, in order to return to a nominal current. Thus, in further exemplary embodiments, smaller references or reference currents can be used, which can reduce an electrical energy consumption.

In further exemplary embodiments, FIG. 2, it is provided that the device 100 is designed to amplify 204*a* the output current I_out, for example to double it. In further exemplary embodiments, this can be used, for example, to increase precision, for example when using a plurality of devices connected in series according to further exemplary embodiments.

Figure 5:
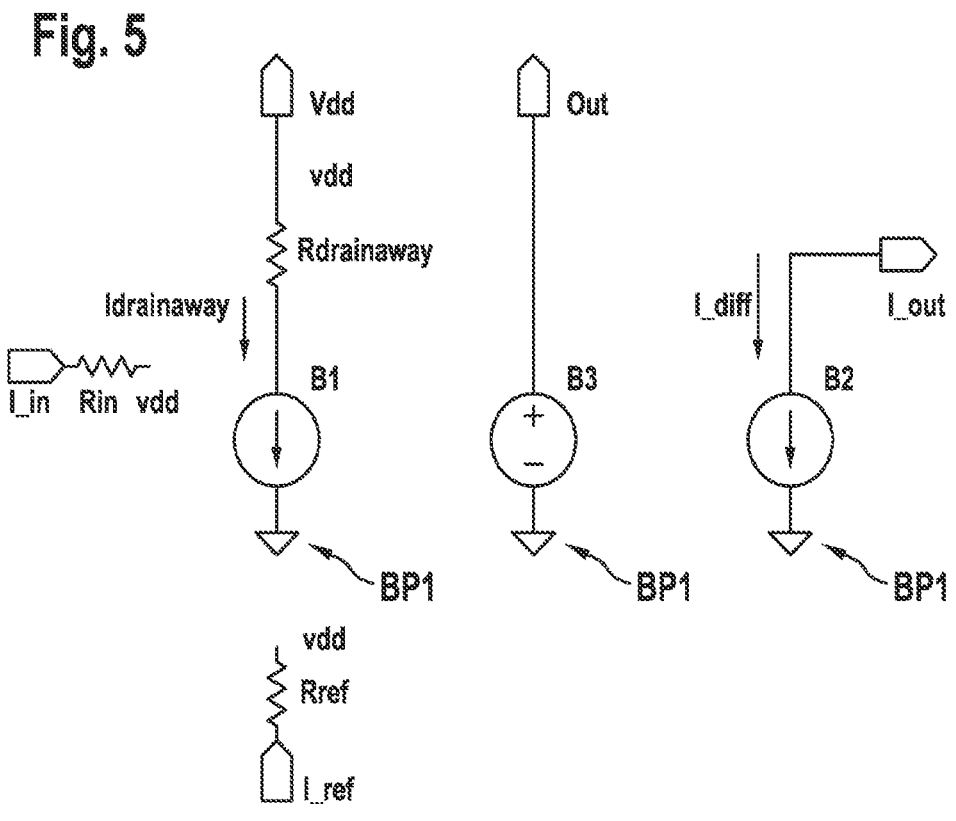
FIG. 5 schematically shows a simplified circuit diagram according to exemplary embodiments of the present invention.

FIG. 5 schematically shows a simplified circuit diagram according to exemplary embodiments, which describes an operating principle of the device 100 by way of example using electrical circuit components. The component Rin symbolizes an optional input resistor, via which the input current I_in can be fed to the device 100. The element BP1 symbolizes a first electrical reference potential, for example ground potential; the element Vdd symbolizes a second electrical reference potential that is different from the first reference potential, for example a potential corresponding to an operating voltage. The component Rin symbolizes an optional reference input resistor, via which the reference current I_ref can be fed. The component Rdrainaway symbolizes an optional discharge resistor, via which a current Idrainaway can be discharged. The element B1 symbolizes a first current source that provides the reference current I_ref as the current Idrainaway if the input current is greater than the reference current, and that otherwise provides no current. The element B2 symbolizes a second current source that provides a differential current I_diff from the input current I_in and the current Idrainaway. The element B3 symbolizes a voltage source that characterizes an electrical potential difference between the output out and the ground potential.

Figure 6:
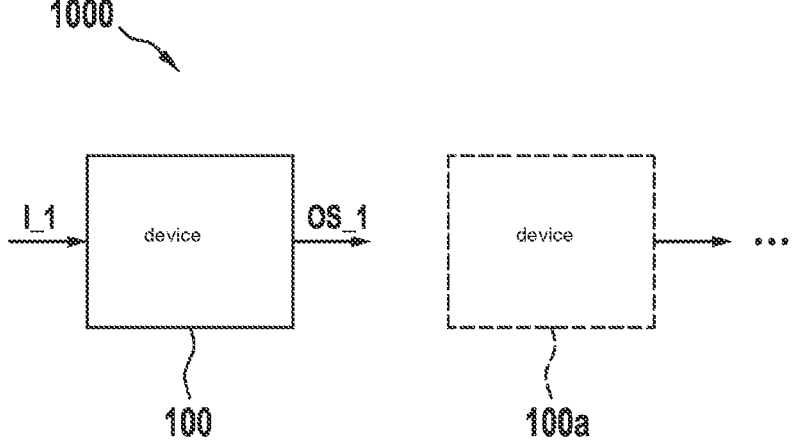
FIG. 6 schematically shows a simplified block diagram according to exemplary embodiments of the present invention.

FIG. 6 schematically shows a simplified block diagram according to exemplary embodiments 1000, in which at least two devices 100, 100*a*, . . . according to the embodiments are provided and, for example, are in each case connected in series with respect to their connections 102, 106, as a result of which, for example, a multi-stage evaluation of the respective input currents for the devices 100, 100*a*, . . . can be realized. In further exemplary embodiments, the configuration 1000 can be used, for example, to provide an analog-to-digital (A/D) converter device that, on the basis of the input current I_1 for the first device 100 of the configuration 1000, generates a binary value comprising a number of binary digits corresponding to the number of devices 100, 100*a*, . . . .

Figure 7:
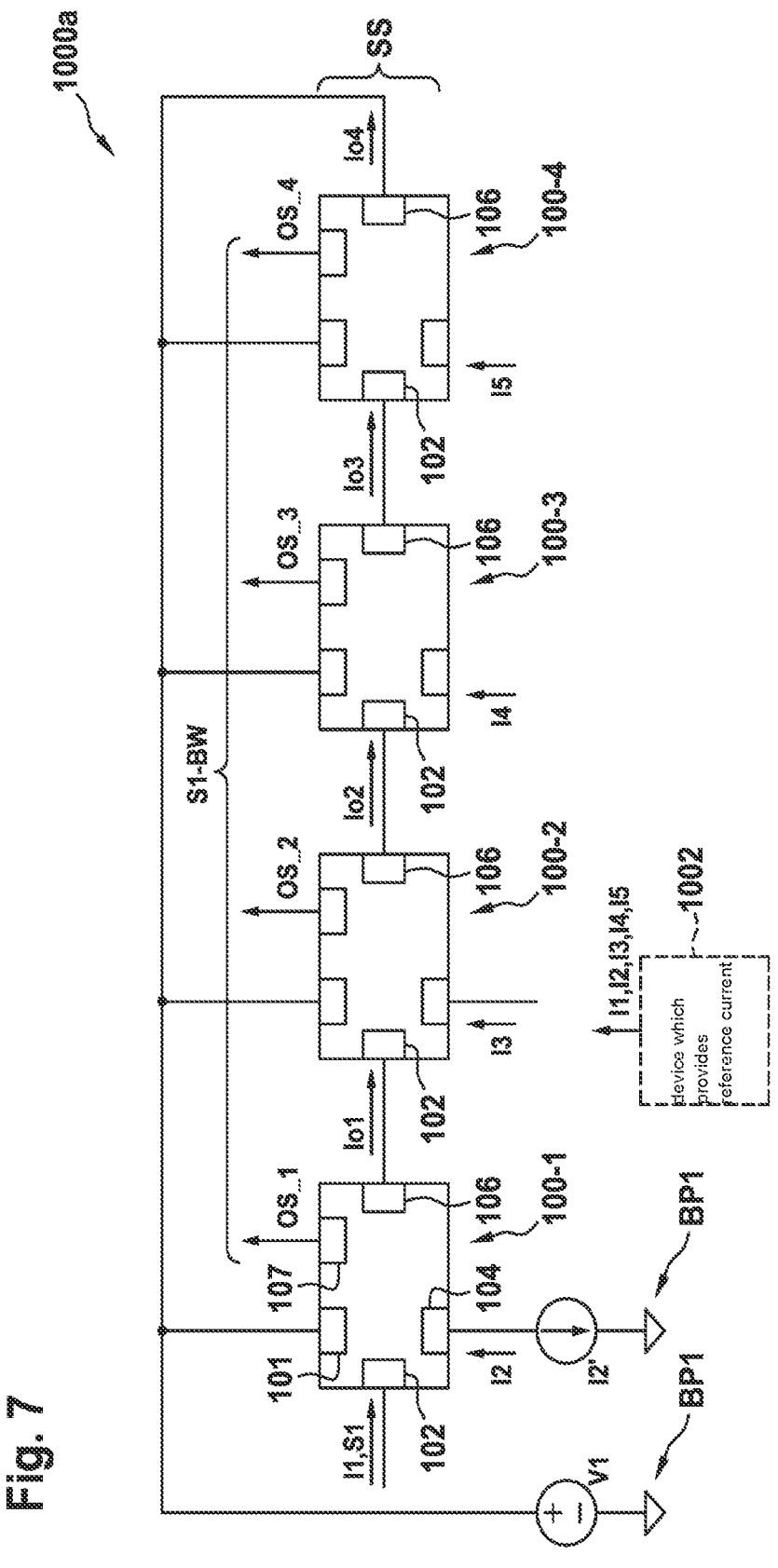
FIG. 7 schematically shows a simplified block diagram according to exemplary embodiments of the present invention.

FIG. 7 schematically shows a simplified block diagram of an A/D converter device 1000*a* according to exemplary embodiments, which, by way of example, comprises a total of four devices 100-1, 100-2, 100-3, 100-4 according to the embodiments. For example, each of the four devices 100-1, 100-2, 100-3, 100-4 has a configuration 100 according to FIG. 1, i.e., for example an input 102, a reference input 104, a first output 106, a second output 107, wherein, for reasons of clarity, the individual components are not designated separately in each case for all four devices according to FIG. 7.

Element V1 symbolizes a supply voltage, the corresponding potential of which can be fed to the devices 100-1, 100-2, 100-3, 100-4 via a respective input 101. Furthermore, the devices 100-1, 100-2, 100-3, 100-4 can in each case also have a connection for a ground potential BP1 (only shown by way of example in the context of the current source I2').

Element 1002 symbolizes an optional device for providing at least one reference current I2, I3, I4, I5, wherein a corresponding current source I2', which can, for example, also be provided by the device 1002, is shown by way of example for the reference current I2. Comparable current sources for the other reference currents I3, I4, I5 can also be provided by the device 1002.

The, by way of example, i=4 devices 100-1, 100-2, 100-3, 100-4 of the converter device 1000a according to FIG. 7 in the present case are in each case connectable in series and/or connected in series with respect to their first input 102 and their first output 106 in a series circuit SS such that a first output 106 of a j-th device 100-1 of the series circuit SS is connected to a first input 102 of a (j+1)-th device 100-2 of the series circuit SS, with j=1, 2, to i−1, thus in the present case by way of example j=1, 2, 3. In other words, an output current Io1 of a device 100-1 preceding in the series circuit SS can be fed as the input current I_in (FIG. 1) to a device 100-2 following in the series circuit SS.

In further exemplary embodiments, it is provided that each of the i devices 100-1, 100-2, 100-3, 100-4 can be fed in each case with a reference current I2, I3, I4, I5, wherein, for example, an identical or a different reference current can be fed, for example by the optional device 1002 already described, to at least some devices of the i devices 100-1, 100-2, 100-3, 100-4.

In further exemplary embodiments, it is provided that each of the i devices 100-1, 100-2, 100-3, 100-4 can be fed in each case with a reference current I2, I3, I4, I5 which corresponds to a position of the respective device 100-1, 100-2, 100-3, 100-4 in the series circuit SS, wherein, for example, a magnitude of the reference currents for devices adjacent in the series circuit SS differs by a predeterminable factor, for example by two. This makes it possible to efficiently provide a binary analog-to-digital converter 1000a, for example. For example, a binary value S1-BW characterizing the input signal S1 or the input current I1 of the analog-to-digital converter 1000a can be obtained by considering the respective binary output signal OS-1, OS-2, OS-3, OS-4 of the individual devices 100-1, 100-2, 100-3, 100-4, wherein, for example, the output signal OS-1 characterizes a most significant bit (MSB), and wherein the output signal OS-4 characterizes a least significant bit (LSB). For this purpose, in further exemplary embodiments, the reference current I3 for the second device 100-2 of the series circuit SS can, for example, be half as large as the reference current I2 for the first device 100-1 of the series circuit SS, and the reference current I4 for the third device 100-3 of the series circuit SS can, for example, be half as large as the reference current I3 for the second device 100-2 of the series circuit SS, and the reference current I5 for the fourth device 100-4 of the series circuit SS can, for example, be half as large as the reference current I4 for the third device 100-3 of the series circuit SS. In other words, for example, the reference current I2 for the device 100-1 can correspond to the MSB, whereas the reference current I5 for the device 100-4 corresponds to the LSB. In further exemplary embodiments, the same reference current can also be used, for example if a gate width of transistors of a comparative current mirror is adapted.

By way of example, the converter device 1000a according to FIG. 7 functions as follows according to further exemplary embodiments: An input current I1 as input signal S1 is fed to the first device 100-1. The first device 100-1 performs the comparison 202 with the reference current I2, which was already described above by way of example with reference to, for example, FIG. 3, and, on the basis of the comparison 202, outputs either the reference current I2 as the output current Io1 at its first output 106 (if the input current I1 is less than the reference current I2, cf. Block 212 according to FIG. 3) or a differential current I1-I2 from the input current I1 and the reference current I2 (if the input current I1 is greater than or equal to the reference current I2, cf. block 214 according to FIG. 3). The further devices 100-2, 100-3, 100-4 operate in a comparable manner, for example with a reduced, for example halved, reference current I3=I2/2, I4=I3/2, I5=I4/2 in each case.

Figures 8A, 8B:
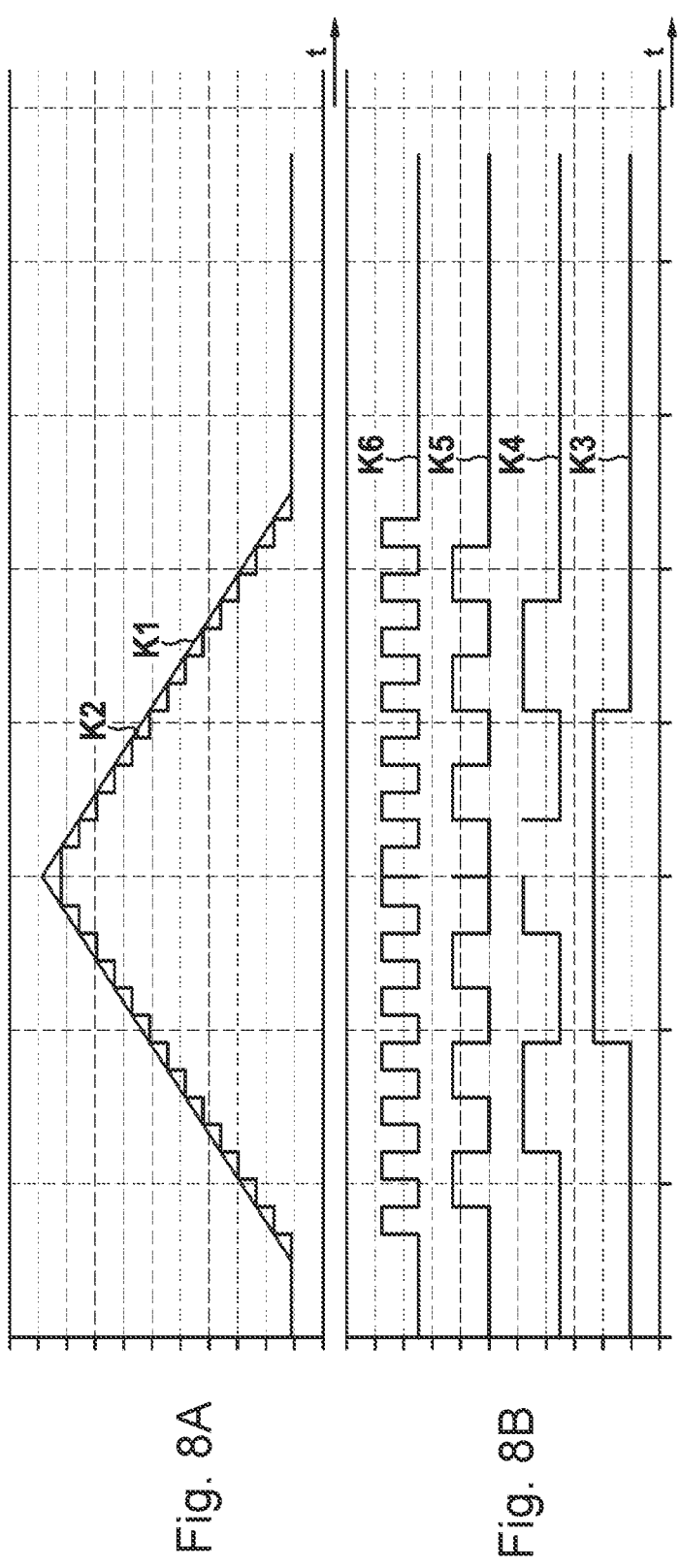
FIG. 8A schematically shows a simplified time diagram according to exemplary embodiments of the present invention.
FIG. 8B schematically shows a simplified time diagram according to exemplary embodiments of the present invention.

FIG. 8A schematically shows a simplified time diagram according to exemplary embodiments. The curve K1 corresponds to a course of the input current I1 (FIG. 7) over the time t, which in the present case is by way of example triangular and by way of example continuous in value, and the curve K2 symbolizes corresponding binary values S1-BW as they are obtained on the basis of the output signals OS-1, OS-2, OS-3, OS-4 of the (current-to-binary value) converter device 1000a, which in the present case is by way of example designed as an i=4 bit converter device 1000a.

FIG. 8B schematically shows a simplified time diagram according to exemplary embodiments. Curve K3 characterizes the two possible states of the MSB characterized by the output signal OS-1 of the device 100-1 according to FIG. 7. Curve K4 characterizes the two possible states of the bit position of the output value S1-BW characterized by the output signal OS-2 of the device 100-2 according to FIG. 7. Curve K5 characterizes the two possible states of the bit position of the output value S1-BW characterized by the output signal OS-3 of the device 100-3 according to FIG. 7. Curve 6 characterizes the two possible states of the bit position (LSB) of the output value S1-BW characterized by the output signal OS-4 of the device 100-2 according to FIG. 7.

Figure 9:
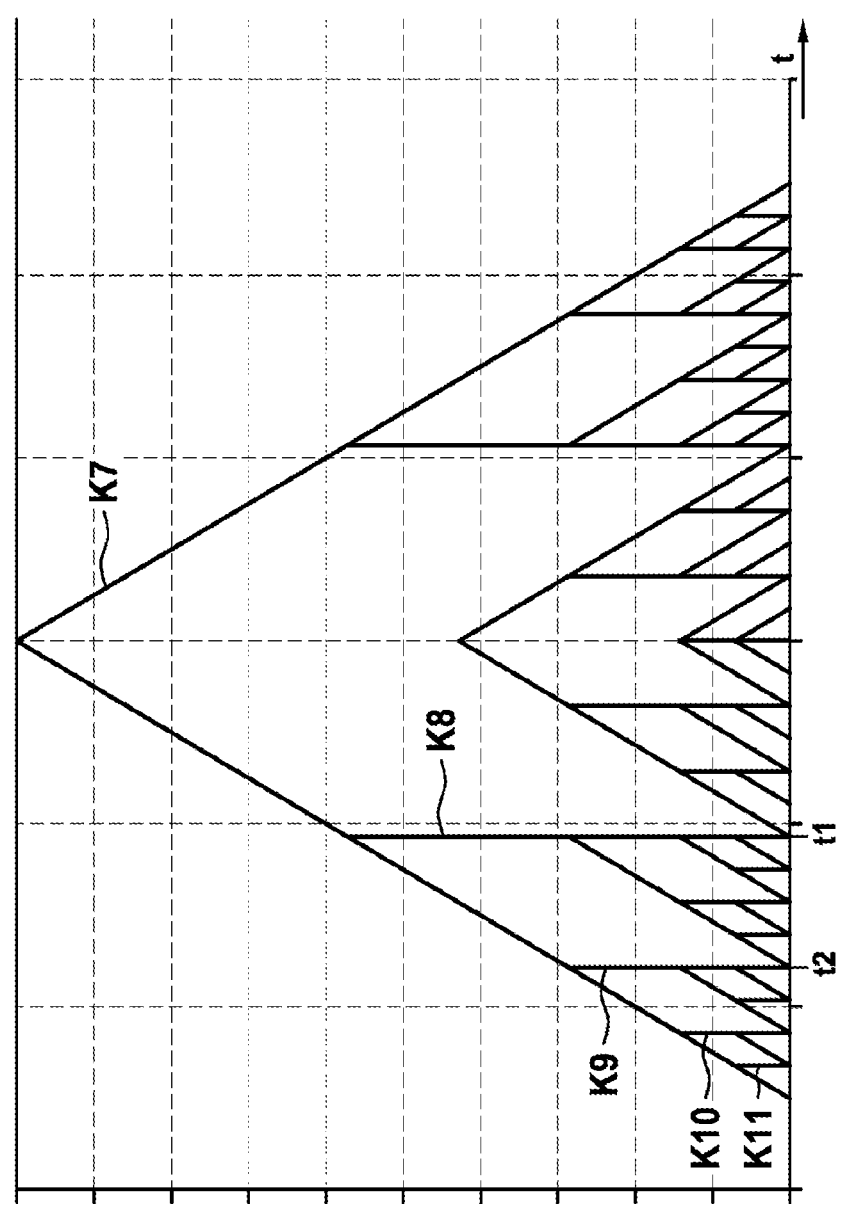
FIG. 9 schematically shows a simplified time diagram according to exemplary embodiments of the present invention.

FIG. 9 schematically shows a simplified time diagram according to exemplary embodiments. The curve K7 symbolizes the course of the input current I1 (FIG. 7) over the time t. The curve K8 symbolizes the course of the output current Io1 of the device 100-1, which is output as the input current for the device 100-2 following in the series circuit SS. It can be seen that, at the point in time t1, the input current I1 (FIG. 7) for the device 100-1 exceeds the corresponding reference current I2 so that a differential current I1-I2 is output by the device 100-1 for times t>t1 as the input current for the device 100-2 following in the series circuit SS.

The curve K9 symbolizes the course of the output current Io2 of the device 100-2, which is output as the input current for the device 100-3 following in the series circuit SS. It can be seen that, at the point in time t2<t1, the input current Io1 (FIG. 7) for the device 100-2 already exceeds the corresponding reference current I3 (since the reference current I3 is, for example, 50% of the reference current I2) so that a differential current Io1-I3 is output by the device 100-2 for times t>t2 as the input current for the device 100-3 following in the series circuit SS.

The curve K10 symbolizes the course of the output current Io3 of the device 100-3, which is output as the input current for the device 100-4 following in the series circuit SS, and the curve K11 according to FIG. 9 symbolizes the course of the output current Io4 of the device 100-4. In further exemplary embodiments, the output current Io4 can also be understood as a measure of a deviation of the binary value S1-BW from the actual current value of the input current I1.

In further exemplary embodiments, it may occur that, in a real implementation, for example of the converter device 1000a according to FIG. 7, the currents output, for example forwarded, to stages or devices 100-2, 100-3, 100-4 downstream in the series circuit SS (i.e., for example, in the direction of the LSB) become comparatively small, see, for example, the curves K9, K10, K11 according to FIG. 9, which can lead to a reduction in precision, for example due to an increasing influence of interference signals on the decreasing currents. This is not shown in the idealized illustration according to FIG. 9. For example, in further exemplary embodiments, non-linearities or a switched operation of non-linear structural elements in a circuit realization and/or charging currents or recharging currents, for example for gate electrodes of MOSFETs used for the circuit realization, can form such interference signals or interference influences.

In further exemplary embodiments, these interference influences can be reduced, for example, by increasing or amplifying, for example doubling, the output current I_out of a relevant device or stage, see, for example, the optional block 204a according to FIG. 2.

If, for example, the first output generates the output current I_out by means of a first transistor, for example MOSFET, a further transistor, for example MOSFET, can be provided, for example in a parallel circuit, to amplify the output current I_out in further exemplary embodiments. Alternatively or additionally, in further exemplary embodiments, a width of a gate electrode of the MOSFET can, for example, be doubled, but this can increase an electrical energy consumption.

In further exemplary embodiments, if, for example, a device 100-3 doubles its output current, it can be provided that a device 100-4 following in the series circuit SS is operated with a reference current that is twice as large, so that the correct functioning of the A/D converter device 1000a, for example with respect to the significance of the individual binary digits, is maintained. In further exemplary embodiments, the two devices 100-3, 100-4 can then, for example, be operated with the same reference current or an equally large reference current I4, I5, which can possibly result in a lower complexity of the device 1002 in further exemplary embodiments.

In further exemplary embodiments in which the reference current I_ref is transformed, for example, into another physical quantity characterizing the reference current I_ref, for example into a bias voltage, for example control voltage, for example for respective gate electrodes of MOSFETs, the same bias voltage can thus be efficiently used, for example, for a plurality of stages or devices 100-3, 100-4, i.e., for example, shared among this plurality of stages or devices 100-3, 100-4, for example because an input resistance of the respective gate electrodes of the MOSFETs is comparatively large, for example negligible for some embodiments.

As already described above by way of example, in exemplary embodiments, a stage or device 100-1, 100-2, . . . of the converter device 1000a (FIG. 7) can in each case discharge or remove a current from the input current I_in (FIG. 1) fed to it, which exceeds its reference current I_ref, which can mean that devices 100-1, 100-2 associated with more significant bits of the converter device 1000a determine an electrical energy consumption more strongly than devices 100-3, 100-4 associated with less significant bits.

In further exemplary embodiments, it can be provided, for example, in order to reduce currents to be processed as quickly as possible as they propagate through the converter device 1000a, to take at least one of the following measures:

a) With respect to the reference current I_ref (FIG. 1), in some exemplary embodiments, for example, the reference current can be reduced, for example halved, and the comparison 202 (FIG. 2) or a comparator device provided for the comparison 202 (see below, for example FIG. 11) can be adapted to the reduction of the reference current such that the comparison result does, for example, not already change if the input current I_in is greater than or equal to the reference current, but such that the comparison result only changes, for example, if the input current I_in is, for example, twice as large as the reference current (i.e., corresponds, for example, to the original, non-halved, reference current), b) With respect to the output current I_out (FIG. 1), in some exemplary embodiments, for example, the output current can be reduced, for example halved, and a reference current of a subsequent stage or device can be adapted such that the reduction, for example halving, of the reference current is compensated.

In further exemplary embodiments, it is provided that the occurring currents are reduced, for example, in a first number of devices or stages at the input of the converter device 1000a (i.e., for example, associated with a first number of more significant bits), for example in the devices 100-1, 100-2, for example by means of at least one of the exemplary measures described above.

In further exemplary embodiments, it is provided that the occurring currents are amplified (see block 204a according to FIG. 2), for example in a second number of devices or stages at the output of the converter device 1000a (i.e., for example, associated with a second number of less significant bits), for example in order to reduce interference influences from noise and/or switching operations.

In further exemplary embodiments, it is provided that the occurring currents, for example, in a third number of devices or stages, for example between the more significant bits and the less significant bits, are, for example, not changed.

Figure 10:
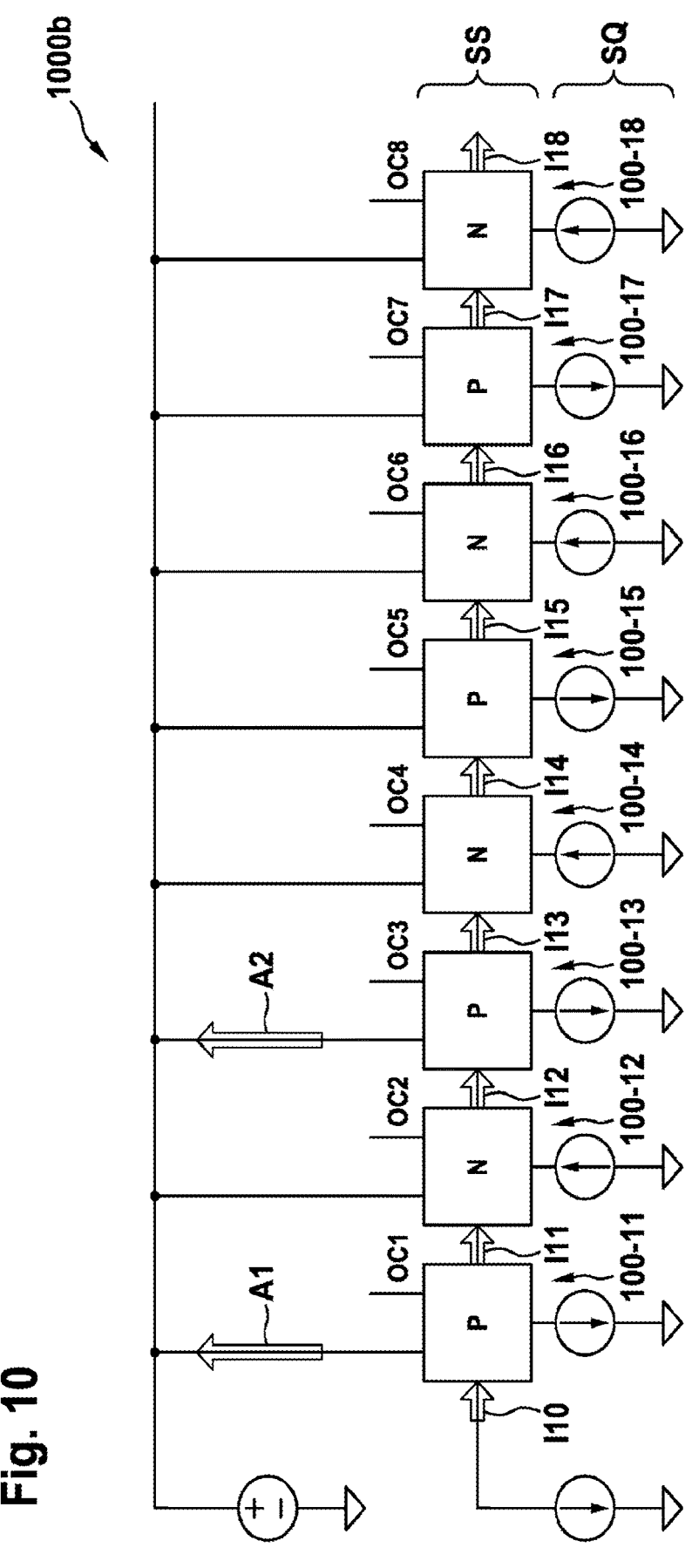
FIG. 10 schematically shows a simplified block diagram according to exemplary embodiments of the present invention.

FIG. 10 schematically shows a simplified block diagram of an A/D converter device 1000b according to exemplary embodiments. In contrast to the configuration 1000a according to FIG. 7 (with i=4 stages or devices 100-1, . . . , 100-4), the configuration 1000b according to FIG. 10 has eight stages or devices 100-11, 100-12, 100-13, 100-14, 100-15, 100-16, 100-17, 100-18, and a supply voltage source V11.

For example, each of the devices 100-11, 100-12, . . . , 100-18 has a configuration 100 according to FIG. 1.

The devices 100-11, 100-12, 100-13, 100-14, 100-15, 100-16, 100-17, 100-18 are arranged with respect to their inputs 102 (FIG. 1) and first outputs 106 (FIG. 1) in a series circuit SS, comparable to FIG. 7. The devices 100-11, 100-12, 100-13, 100-14, 100-15, 100-16, 100-17, 100-18 provide a total of eight respective binary output signals OC1, OC2, OC3, OC4, OC5, OC6, OC7, OC8, wherein the output signal OC1 corresponds, for example, to the MSB, and wherein the output signal OC8 corresponds, for example, to the LSB.

Also shown in FIG. 10 is an input current I10, which can be fed to the first device 100-11 of the series circuit SS of the converter device 1000b. An output current of the device 100-11, which can be fed to the device 100-12 downstream in the series circuit SS, is designated by the reference sign I11 in FIG. 10. Comparable output currents of the further stages or devices 100-12, 100-13, 100-14, 100-15, 100-16, 100-17, 100-18 are designated by I12, I13, I14, I15, I16, I17, I18.

Each of the devices 100-11, 100-12, 100-13, 100-14, 100-15, 100-16, 100-17, 100-18 is assigned a reference current source, which is not individually but collectively designated by the reference sign SQ. It can be seen from the arrows assigned to the reference current sources that different reference currents can have different current directions in further exemplary embodiments. Likewise, in further exemplary embodiments, different devices can, for example, in each case have a different polarity configuration P, N, which is described in more detail below with reference to FIGS. 12, 13. For example, the devices 100-11, 100-13, 100-15, 100-17 in the present case have a polarity configuration of type P, while the devices 100-12, 100-14, 100-16, 100-18 in the present case have a polarity configuration of type N, which can be provided in further exemplary embodiments, for example, to reduce a complexity of circuit realizations of the respective devices.

The block arrows A1, A2 according to FIG. 10 symbolize that the two devices 100-11, 100-13 in each case receive an input current I10, I12 that is greater than their respective reference current, so that, in further exemplary embodiments, the "current component" corresponding to the respective reference current is discharged to the supply voltage source V11. This does not apply to the rest of the devices 100-12, 100-14, 100-15, 100-16, 100-17, 100-18, i.e., the respective input currents I11, I13, I14, I15, I16, I17 are in each case less than the respective reference current of the relevant device 100-12, 100-14, 100-15, 100-16, 100-17, 100-18. This is equivalent to a binary value formed by the converter device 1000b on the basis of the input current I10 corresponds to the value 10100000.

Figure 11:
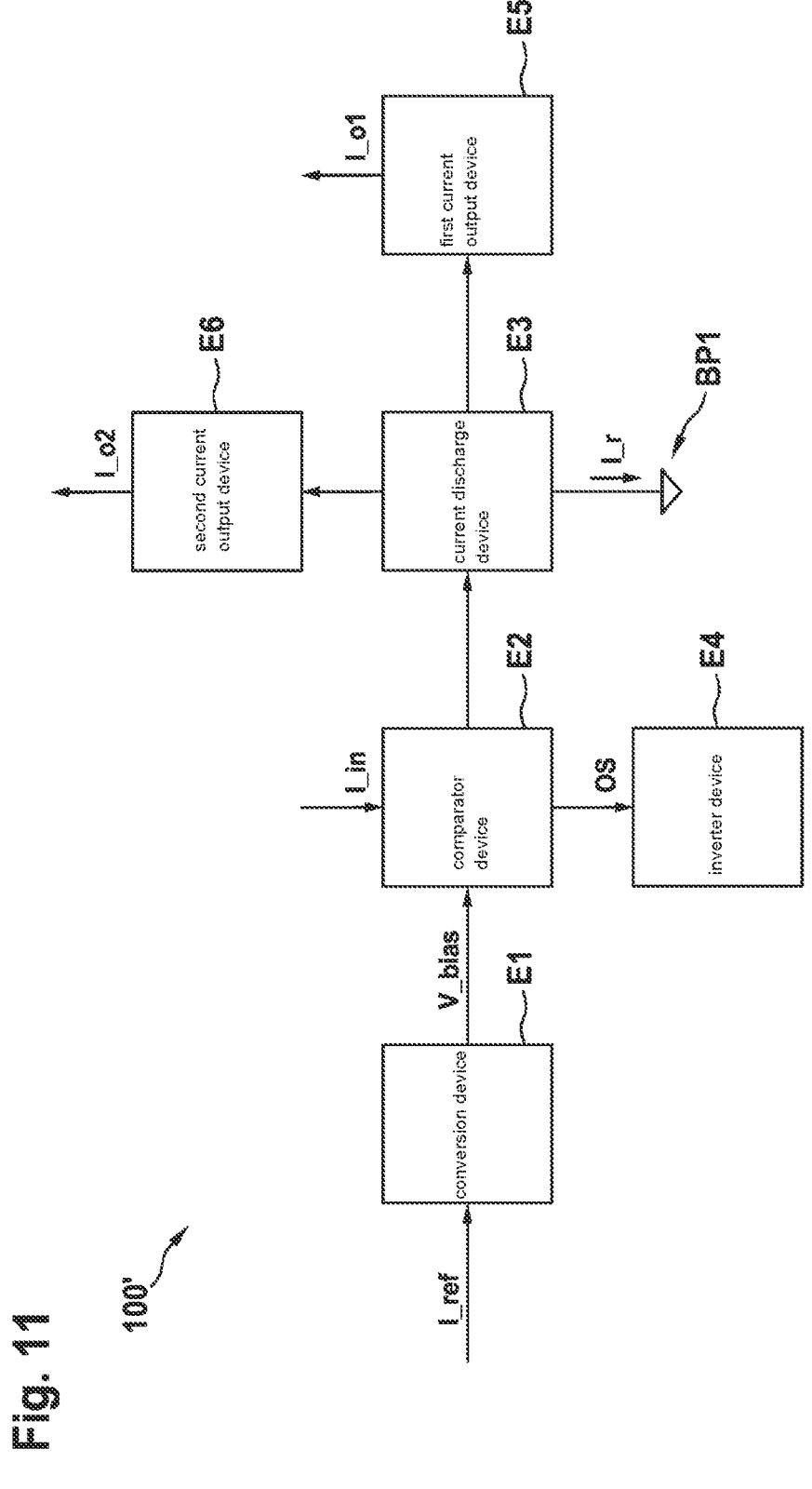
FIG. 11 schematically shows a simplified block diagram according to exemplary embodiments of the present invention.

In further exemplary embodiments, FIG. 11, it is provided that the device 100' has at least one of the following elements: a) a conversion device E1, which is designed to generate a bias voltage V_bias, for example control voltage, on the basis of a reference current I_ref, for example for a comparator device E2, b) a comparator device E2, which is designed to compare the input current I_in with the reference current I_ref and/or to compare a quantity characterizing the input current (for example, an electrical voltage, for example the bias voltage V_bias) with a quantity characterizing the reference current (for example, a further electrical voltage) (see also, for example, block 202 according to FIG. 2), wherein, for example, the comparator device E2 is designed to output an output signal OS on the basis of the comparison 202, c) a current discharge device E3, which is designed to discharge a current I_r at least temporarily, for example at least temporarily to a first reference potential BP1, for example a ground potential, d) an inverter device E4, which is designed to invert one, or the, output signal OS at least once (or, in further exemplary embodiments, several times), e) a first current output device E5, which is designed to output a first current I_o1 at least temporarily at the first output 106 (FIG. 1), for example if the input current I_in is less than the reference current I_ref, f) a second current output device E6, which is designed to output a second current I_o2 at least temporarily at the first output 106, for example if the input current I_in is greater than the reference current I_ref.

Figure 12:
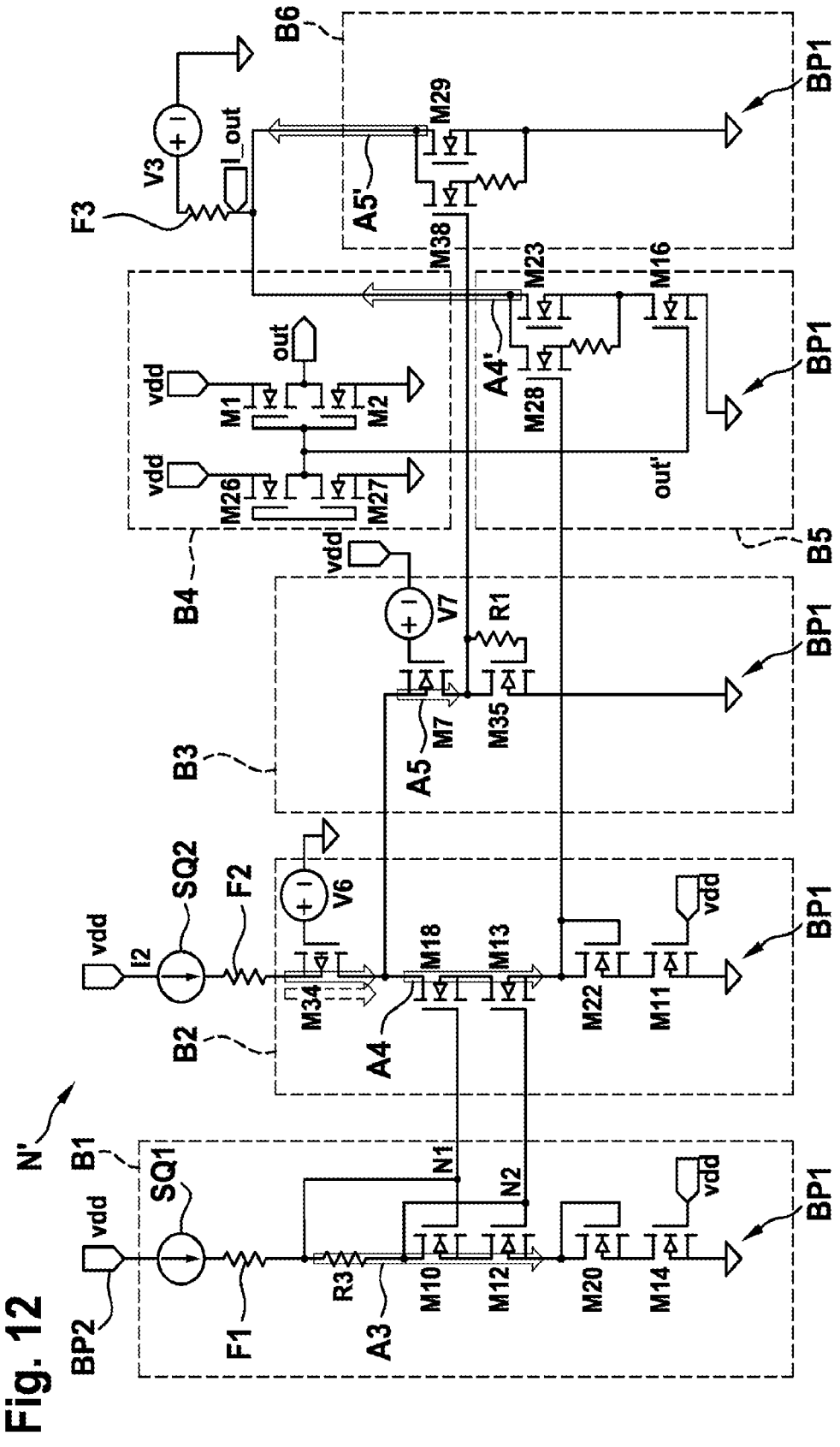
FIG. 12 schematically shows a simplified circuit diagram according to exemplary embodiments of the present invention.

FIG. 12 shows an exemplary configuration N' for a circuit realization of the device 100, 100', 100-1, . . . according to the embodiments in a first polarity configuration, type N (see also, for example, FIG. 10). The conversion device E1 according to FIG. 11 is symbolized by way of example by the block B1 in FIG. 12. The components E2, E3, E4, E5, E6 according to FIG. 11 are symbolized by way of example in FIG. 12 by the blocks B2, B3, B4, B5, B6.

In further exemplary embodiments, the conversion device B1 has: at least one transistor, for example transistor M10, or a series circuit of at least two transistors M10, M12. In further exemplary embodiments, the at least one transistor M10, M12 is, for example, a MOSFET, metal-oxide semiconductor field-effect transistor, for example an N-channel MOSFET. In further exemplary embodiments, further transistors described below by way of example can, for example, also be designed as MOSFETs (N-channel or P-channel, see circuit symbols in FIG. 12).

In further exemplary embodiments, the conversion device B1 can have at least one further transistor, in the present case two MOSFETS M14, M20, for example in series with the aforementioned transistors M10, M12, as a result of which it is possible in further exemplary embodiments to compensate, for example, for a voltage drop at at least one further component of the device N'. For example, the MOSFET M20 can be used to compensate for a voltage drop at the MOSFET M22, which is described in more detail below, and/or the MOSFET M14 can be used to compensate for a voltage drop at the MOSFET M11, which is described in more detail below.

In further exemplary embodiments, the conversion device B1 can have at least one resistor R3 or (for example, alternatively to the resistor R3) a diode, for example Schottky diode, for example in series with the aforementioned transistor(s) M10, M12, as a result of which, in further exemplary embodiments, a voltage difference ("offset") can, for example, be generated between bias voltages that can be generated by means of the conversion device B1, for example on the basis of the reference current A3, for example for a, or the, comparator device B2. Thus, the mentioned offset acts, for example, at the circuit nodes N1, N2.

Optionally, the conversion device B1 can have a first fuse F1, which can be used, for example, for simulation purposes of the configuration N' but can be omitted in real circuit implementations.

The optional current source SQ1 symbolizes the reference current I_ref already indicated by the block arrow A3 (FIG. 1), which can be fed to the conversion device B1 in further exemplary embodiments. The optional current source SQ1 can, for example, be used, in a manner similar to the optional first fuse F1, for simulation purposes of the configuration N' and can also be omitted in further exemplary embodiments, for example for a real circuit implementation.

In further exemplary embodiments, the comparator device B2 can have at least one transistor M18 or a series circuit of at least two transistors, for example MOSFETs, M18, M13, which can be controlled, for example, by means of the bias voltage(s), which can be generated, for example, by the conversion device B1.

In further exemplary embodiments, the comparator device B2 can have at least one further transistor M11, for example in series with the aforementioned transistor(s) M13, M18, as a result of which it is possible in further exemplary embodiments to compensate, for example, for a voltage drop at at least one further component M16 of the device.

In further exemplary embodiments, the comparator device B2 can have at least one further transistor M22, for example in series with the aforementioned transistor(s) M18, M13, M11, wherein the at least one further transistor M22 is, for example, part of a current mirror circuit, for example in order to copy a current A4 flowing through the comparator device B2, for example the input current I_in, for example for a further component B5 of the device. Further parts of the current mirror circuit comprising the transistor M22 are, for example, the transistor M23 and/or M28 of the component B5.

In further exemplary embodiments, the comparator device B2 can have at least one further transistor M34, for example in order to stabilize an input voltage level. The transistor M34 can be controlled, for example, by the optional voltage source V8. For example, the transistor M34 is connected as a source follower (in pnp transistors, corresponding to an emitter follower). Thus, the transistor M34 attempts to maintain a fixed voltage level at the source electrode, which in further exemplary embodiments is also the input to the converter stage. For example, in this case, the transistor M34 becomes conductive if current is allowed to flow from the current source SQ2, and becomes highly resistive if this is no longer the case. As a result, the voltage level at the current source SQ2 remains approximately constant. This is important in further exemplary embodiments, for example for upstream converter stages since their current output, for example a MOSFET, also depends on the voltage level at the output of this MOSFET.

FIG. 12 also shows a second fuse F2 and a second current source SQ2, both of which are used, for example exclusively, for simulation purposes of the configuration N' in further exemplary embodiments, and which can be omitted in further exemplary embodiments, for example for a real circuit implementation.

In further exemplary embodiments, the current discharge device B3 can have at least one transistor, for example MOSFET, M7, which at least temporarily discharges a current A5, for example from the comparator device B2. Optionally, a voltage source V7 is provided for controlling the MOSFET M7. In further exemplary embodiments, the current discharge device B3 can have at least one further transistor, for example MOSFET, M35, which is, for example, part of a current mirror circuit, for example in order to copy the current A5 flowing through the current discharge device B3, for example the current A5 discharged from the comparator device B2, for example for a further component B6 of the device. Further parts of the current mirror circuit comprising the transistor M35 are, for example, the transistor M29 and/or M33 of the component B6.

In further exemplary embodiments, the inverter device B4 can have at least one series circuit of two transistors, for example MOSFETs, M26, M27 and M1, M2, for example two MOSFETs per inverter stage. In the present case, the inverter device B4 accordingly has two inverter stages, for example for reasons of a correct interpretation of the binary output signal out of the device N' according to FIG. 12.

In further exemplary embodiments, the first current output device B5 can have a first transistor, for example MOSFET, M23, which is part of the current mirror circuit M22, M23, which mirrors, for example, a current A4 of the comparator device B2 into the first current output device B5. In further exemplary embodiments, the first current output device B5 can have a second transistor, for example MOSFET, M28, which is connected, for example, in parallel with the first transistor M23 of the first current output device B5, and which also mirrors the current A4 of the comparator device B2 into the first current output device B5, as a result of which the total current mirrored into the first current output device B5 can be doubled, for example.

In further exemplary embodiments, the first current output device B5 can have a third transistor, for example MOSFET, M16, which selectively activates or deactivates the first current output device B5, for example on the basis of the output signal out or a pre-stage out' thereof. In other words, it can be controlled in further exemplary embodiments, on the basis of the signal out', whether a current A4', which can be mirrored or is mirrored (or multiply mirrored (MOSFET M28) or amplified) by means of current mirrors M22, M23 from the comparator device B2, is to be output as the output current I_out by means of the first current output device B5.

For example, in further exemplary embodiments, the first current output device B5 can be activated to output the current A4' if a binary value "0" is output by the device N'.

In further exemplary embodiments, the second current output device B6 can have a transistor, for example MOSFET, M29, which is part of a current mirror circuit M35, M29, which mirrors, for example, a current A5 of the current discharge device B3 into the second current output device B6, cf. the block arrow A5'. In further exemplary embodiments, the second current output device B6 can have a second transistor, for example MOSFET, M33, which is connected, for example, in parallel with the first transistor M29 of the second current output device B6, and which also mirrors the current A5 of the current discharge device B3 into the second current output device B6, as a result of which the total current A5' mirrored into the second current output device B6 can be doubled, for example. For example, in further exemplary embodiments, the second current output device B6 can be activated to output the current A5' if a binary value "1" is output by the device N'.

In further exemplary embodiments, the current source SQ2 provides an input current for a simulation of the circuit N' according to FIG. 12, wherein the current source SQ2 is used, for example exclusively, for an individual simulation of the circuit N'. In further exemplary embodiments with multiple blocks or stages, the current source SQ2 can be omitted, for example, and the current from a preceding block can be provided instead, for example.

Optionally, the configuration N' according to FIG. 12 can have a third fuse F3, which can be used, for example, for simulation purposes of the configuration N' but can be omitted for real circuit implementations.

The optional voltage source V3 can be used, for example, for a simulation of the circuit N' according to FIG. 12, wherein it characterizes an input of a subsequent block or a subsequent stage.

Figure 13:
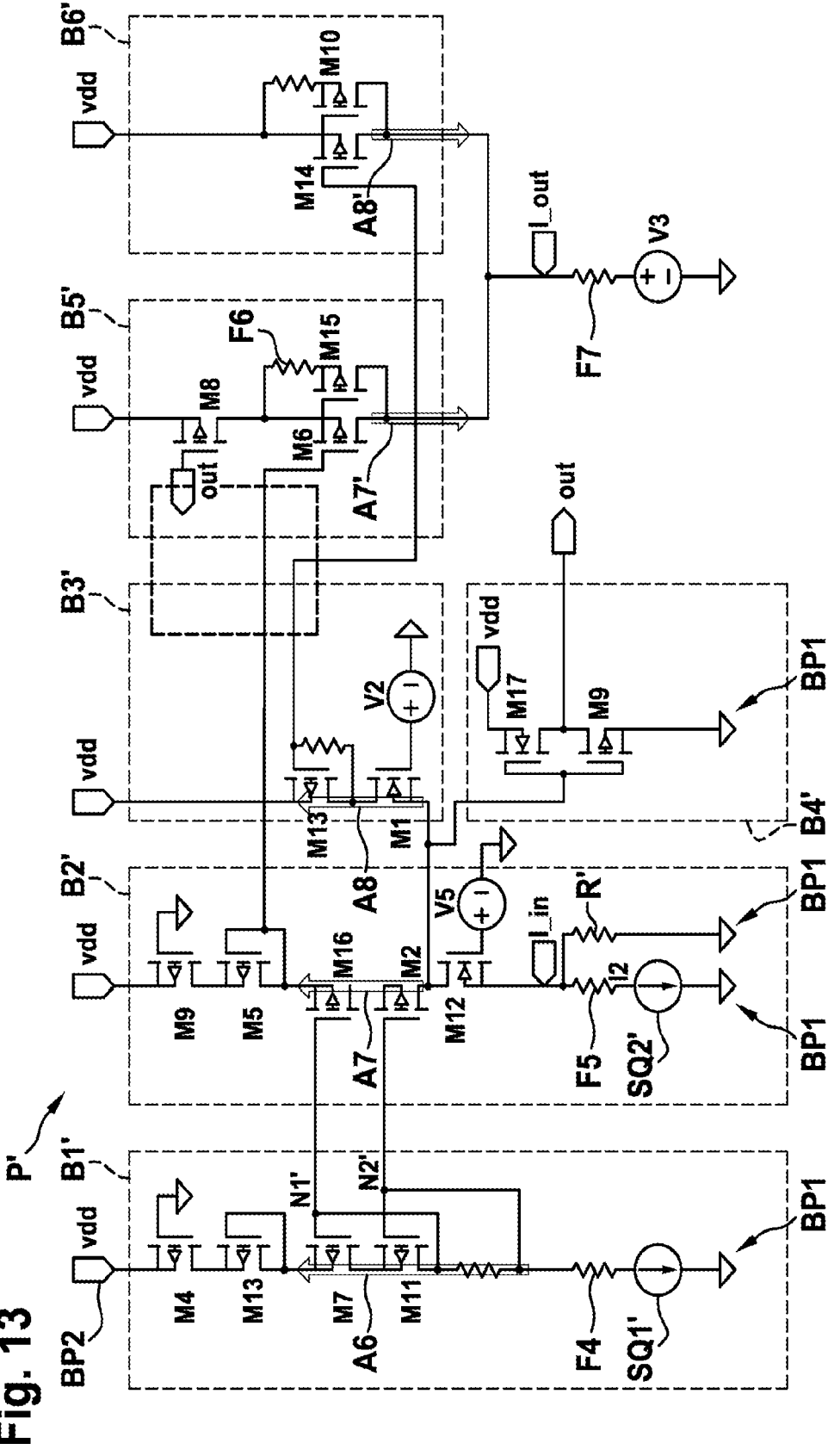
FIG. 13 schematically shows a simplified circuit diagram according to exemplary embodiments of the present invention.

FIG. 13 shows an exemplary configuration P' for a circuit realization of the device 100, 100', 100-1, . . . according to the embodiments in a second polarity configuration, type P (see also, for example, FIG. 10). The conversion device E1 according to FIG. 11 is symbolized by way of example by the block B1' in FIG. 13. The components E2, E3, E4, E5, E6 according to FIG. 11 are symbolized by way of example in FIG. 13 by the blocks B2', B3', B4', B5', B6'.

In further exemplary embodiments, the conversion device B1' has: at least one transistor M7 or a series circuit of at least two transistors M7, M11. In further exemplary embodiments, the at least one transistor M7, M11 is, for example, a MOSFET, metal-oxide semiconductor field-effect transistor, for example a P-channel MOSFET. In further exemplary embodiments, further transistors described below by way of example can, for example, also be designed as MOSFETs (N-channel or P-channel, see circuit symbols in FIG. 13).

In further exemplary embodiments, the conversion device B1' can have at least one further transistor, in the present case two MOSFETS M3, M4, for example in series with the aforementioned transistors M7, M11, as a result of which it is possible in further exemplary embodiments to compensate, for example, for a voltage drop at at least one further component of the device P'. For example, the MOSFET M4 can be used to compensate for a voltage drop at the MOSFET M9, which is described in more detail below, and/or the MOSFET M3 can be used to compensate for a voltage drop at the MOSFET M5, which is described in more detail below.

In further exemplary embodiments, the conversion device B1' can have at least one resistor R1 or (for example, alternatively to the resistor R1) a diode, for example Schottky diode, for example in series with the aforementioned transistor(s) M7, M11, as a result of which, in further exemplary embodiments, a voltage difference ("offset") can, for example, be generated between bias voltages that can be generated by means of the conversion device B1', for example on the basis of the reference current A6, for example for a, or the, comparator device B2'. Thus, the mentioned offset acts, for example, at the circuit nodes N1', N2'.

Optionally, the conversion device B1 can have a fuse F4, which can be used, for example, for simulation purposes of the configuration P' but can be omitted in real circuit implementations.

The optional current source SQ1' symbolizes the reference current I_ref (FIG. 1) already indicated by the block arrow A6, which can be fed to the conversion device B1' in further exemplary embodiments. The optional current source SQ1' can, for example, be used, in a manner similar to the optional fuse F4, for simulation purposes of the configuration P' and can also be omitted in further exemplary embodiments, for example for a real circuit implementation.

In further exemplary embodiments, the comparator device B2' can have at least one transistor M2 or a series circuit of at least two transistors, for example MOSFETs, M2, M16, which can be controlled, for example, by means of the bias voltage(s), which can be generated, for example, by the conversion device B1'.

In further exemplary embodiments, the comparator device B2' can have at least one further transistor M9, for example in series with the aforementioned transistor(s) M2, M16, as a result of which it is possible in further exemplary embodiments to compensate, for example, for a voltage drop at at least one further component M8 of the device P'.

In further exemplary embodiments, the comparator device B2' can have at least one further transistor M5, for example in series with the aforementioned transistor(s) M2, M16, M9, wherein the at least one further transistor M5 is, for example, part of a current mirror circuit, for example in order to copy a current A7 flowing through the comparator device B2', for example the input current I_in, for example for a further component B5' of the device P+. Further parts of the current mirror circuit comprising the transistor M5 are, for example, the transistor M15 and/or M6 of the component B5'.

In further exemplary embodiments, the comparator device B2' can have at least one further transistor M9, for example in order to stabilize an input voltage level.

FIG. 13 also shows a fuse F5 as well as a current source SQ2' and a resistor R', both of which are used, for example exclusively, for simulation purposes of the configuration P' in further exemplary embodiments, and which can be omitted in further exemplary embodiments, for example for a real circuit implementation.

In further exemplary embodiments, the current discharge device B3' can have at least one transistor, for example MOSFET, M1, which at least temporarily discharges a current A8, for example from the comparator device B2'. Optionally, a voltage source V2' is provided for controlling the MOSFET M1. In further exemplary embodiments, the current discharge device B3' can have at least one further transistor, for example MOSFET, M13, which is, for example, part of a current mirror circuit, for example in order to copy the current A8 flowing through the current discharge device B3', for example the current A8 discharged from the comparator device B2', for example for a further component B6' of the device. Further parts of the current mirror circuit comprising the transistor M1 are, for example, the transistor M10 and/or M11 of the component B6'.

In further exemplary embodiments, the inverter device B4' can have at least one series circuit of two transistors, for example MOSFETs, M17, M19. In the present case, the inverter device B4' accordingly has an inverter stage, for example in contrast to the inverter device B4 according to FIG. 12.

In further exemplary embodiments, the first current output device B5' according to FIG. 13 can have a first transistor, for example MOSFET, M15, which is part of the current mirror circuit M5, M15, which mirrors, for example, a current A7 of the comparator device B2' into the first current output device B5'. In further exemplary embodiments, the first current output device B5' can have a second transistor, for example MOSFET, M6, which is connected, for example, in parallel with the first transistor M15 of the first current output device B5', and which also mirrors the current A7 of the comparator device B2' into the first current output device B5', as a result of which the total current A7' mirrored into the first current output device B5' can be doubled, for example.

In further exemplary embodiments, the first current output device B5' can have a third transistor, for example MOSFET, M8, which selectively activates or deactivates the first current output device B5', for example on the basis of the output signal out. In other words, it can be controlled in further exemplary embodiments, on the basis of the signal out, whether a current A7', which can be mirrored or is mirrored (or multiply mirrored (MOSFET M26) or amplified) by means of current mirrors M5, M15 from the comparator device B2', is to be output as the output current I_out by means of the first current output device B5'. For example, in further exemplary embodiments, the first current output device B5' can be activated to output the current A4' if a binary value "0" is output by the device P'.

In further exemplary embodiments, the second current output device B6' can have a transistor, for example MOSFET, M10, which is part of a current mirror circuit M10, M13, which mirrors, for example, a current A8 of the current discharge device B3' into the second current output device B6', cf. the block arrow A8'. In further exemplary embodiments, the second current output device B6' can have a second transistor, for example MOSFET, M14, which is connected, for example, in parallel with the first transistor M10 of the second current output device B6', and which also mirrors the current A8 of the current discharge device B3' into the second current output device B6', as a result of which the total current A8' mirrored into the second current output device B6' can be doubled, for example. For example, in further exemplary embodiments, the second current output device B6' can be activated to output the current A8' if a binary value "1" is output by the device P'.

Optionally, for example for simulation purposes, a resistor R2 can be provided in the block B3', which can, for example, accelerate a simulation process, and which can be omitted in a real circuit implementation.

In further exemplary embodiments, it is provided that the device P+ of the second polarity configuration is designed to receive an input current I_in flowing from a second reference potential BP2, VDD, which is different from a, or the, first reference potential BP1, for example an operating voltage potential associated with an operating voltage VDD, and to output the output current I_out to the second reference potential, for example operating voltage potential.

Optionally, the configuration P' according to FIG. 13 can have at least one further fuse F6, F7, which can be used, for example, for simulation purposes of the configuration P' but can be omitted in real circuit implementations.

The optional voltage source V3 can be used, for example, for a simulation of the circuit P' according to FIG. 13, wherein it characterizes an input of a subsequent block or a subsequent stage or represents its effect.

In the following, aspects of operation of the component N' according to FIG. 12 are described by way of example, which can also be applied in an analogous manner to the component P' according to FIG. 13.

As long as the output signal out is zero, i.e., the input current I_in or A4 is less than the reference current I_ref or A3, the input current I_in is output at the first output 106 (FIG. 1), which is performed, for example, by means of the transistors M22, M23 in further exemplary embodiments.

In further exemplary embodiments, the component B5 is deactivated as soon as the output signal out indicates a value "1" or "High," which is performed, for example, by the transistor M16. Due to the non-vanishing resistance of the transistor M16 (or its drain-source path) in the switched-on state (RDS_on), a voltage drop occurs at the drain-source path of the transistor M16, which in further exemplary embodiments can be compensated, for example, in the conversion device B1 and in the comparator device B2, for example by means of the transistors M11, M14. In further exemplary embodiments, the transistors M11, M14 can be operated as resistors and can, in further exemplary embodiments, also be replaced by a resistor, for example with the value RDS_on of the transistor M16. However, in further exemplary embodiments, MOSFETs are used as transistors M11, M14, which can contribute to better thermal stability.

As long as the output signal is one (i.e., "High"), i.e., the input current I_in is greater than the reference current I_ref, the reference current I_ref is subtracted from the input current I_in, and only the remaining differential current A5' is output as the output current, which can be controlled, for example, by the transistor M7 of the block B3. For example, the transistor M7 switches on as soon as the potential at its source electrode (and at its output or drain electrode) rises. In further exemplary embodiments, a current A4 corresponding to the reference current I_ref continues to flow through the comparator device B2, while a current A5 exceeding the current A4 is discharged through the transistor M7 of the current discharge device B3. This current A5 is then mirrored by means of the current mirror M35, M29 and leaves the circuit N' as the output current I_out.

In further exemplary embodiments, the transistors M28 and M33 enable amplification, for example doubling, of the output current. In further exemplary embodiments, these transistors M28 and M33 can be selectively activated or deactivated, for example by means of at least one fuse F3a, F3b. As a result, in further exemplary embodiments on the basis of the same circuit layout N', both devices with amplified output current (M28 and/or M33 active) and devices with non-amplified output current (M28 and/or M33 inactive) can be efficiently provided. The optional output current amplification can be used in further exemplary embodiments, for example in converter devices 1000a, 1000b, for example for stages or devices 100 which are further away from the input in the series circuit SS, which operate at lower current intensities due to the above-described operating principle according to exemplary embodiments, and in which, for example, a non-vanishing capacitance of the gate electrode of the real MOSFETs affect the relevant current signal waveforms.

In further exemplary embodiments, a width of the gate electrode of the primary transistor M23 can, for example, be increased, for example, doubled, as an alternative or in addition to a second transistor M28, in order to achieve a desired output current amplification.

In further exemplary embodiments, the comparator device B2 (FIG. 12) is controlled by the conversion device B1, for example by means of the bias voltage(s) V_bias (FIG. 11), see also the circuit nodes N1, N2 according to FIG. 12 and the optional resistor R3.

In further exemplary embodiments, the transistor M12 provides the bias voltage for the transistor M13. In further exemplary embodiments, the transistor M10 provides the bias voltage for the transistor M18. In further exemplary embodiments, the bias voltage for the transistor M18 is somewhat greater, for example between approximately 20 millivolts, mV, and approximately 200 mV, than the bias voltage for the transistor M13. This offset can be provided, for example, by the optional resistor R3, which can also be replaced in further exemplary embodiments by a diode, for example a Schottky diode.

In further exemplary embodiments, an advantage of the configuration described, by way of example, above is that, if the input current I_in reaches the current intensity of the reference current I_ref, the potential of the drain electrode of the transistor M13 will rise because the transistor M13 can no longer provide the required current intensity. As soon as this rise in the potential of the drain electrode of the transistor M13 exceeds the offset applied across the resistor R3, the transistor M18 begins to switch off, which further accelerates the rise in the potential of the drain electrode of the transistor M13. As a result, a comparatively precise and steep flank can thereby be achieved in further exemplary embodiments. According to investigations by the applicant, this works comparatively well in further exemplary embodiments, in particular at currents in the milliampere (mA) range, while the optional components R3, M10, M18 can be omitted in further exemplary embodiments, for example for smaller currents, for example in the range of a few nanoamperes, nA.

In further exemplary embodiments, the conversion device B1 can also be influenced, for example, to provide a nominal bias voltage for the comparator device B2 on the basis of half the reference current I_ref. In further exemplary embodiments, this can be achieved, for example, by modifying the dimensions of the gate electrodes of the MOSFETs M12, M10 or the MOSFETS M18, M13. In further exemplary embodiments, the same bias voltage can, for example, be used for a plurality of devices N' or 100, . . . of, for example, a same A/D converter device and/or mutually adjacent A/D converter devices, wherein, for example, only one reference current I_ref is required.

In further exemplary embodiments, the device N' or P' can, for example, use an additional current mirror, which increases an electrical power consumption but allows a current direction of the input current to be adjusted to match the current direction of the output current. In these embodiments, for example, devices with the same polarity configuration N or P can be used for a converter device. Alternatively, in further exemplary embodiments, it can be provided that at least two successive devices in the series circuit SS (FIG. 10) in each case have a different polarity configuration P, N, for example according to FIGS. 12, 13, wherein, for example, a plurality of, for example all, successive devices in the series circuit SS in each case have an alternating polarity configuration P, N, P, . . . , wherein, for example, the respective polarity configuration corresponds to a position of the respective device in the series circuit SS. In further exemplary embodiments, this can help reduce a complexity of the individual devices 100-11, 100-12, . . . (for example, with respect to optional additional current mirrors) and an electrical energy consumption.

In further exemplary embodiments, the device N' or its inverter device B4 can have one inverter stage M26, M27, instead of two inverter stages, wherein the inverted state of the output signal out' can possibly be taken into account by a target system 1000a, 1000b of the device N'.

In further exemplary embodiments, it is also possible to arrange a plurality of devices N', P' "one above the other" with respect to an electrical reference potential, for example to stack them, wherein, for example, a first device has the ground potential as the reference potential and an operating voltage of, for example, 0.5 volt, while a second device has the potential of 0.5 volt (relative to the ground potential) as the reference potential and an operating voltage of 1.0 volt, etc. In these embodiments, it can be made possible, for example, to dispense with internal current mirrors of the devices because the output current of each device would leave the respective device in the same direction as the direction of the input current of the respective device. In other words, in these embodiments, the entire circuit 1000a, 1000b could be supplied by the current to be measured or the input current I_in.

Further exemplary embodiments, FIG. 2, relate to a method for operating a device 100 (FIG. 1) comprising a first input 102 for receiving an input current I_in, a second input 104 for receiving a reference current I_ref, and a first output 106, wherein the method comprises: comparing 202 the input current I_in with the reference current I_ref; and outputting 204 an output current I_out at the first output 106 on the basis of the comparison 202.

In further exemplary embodiments, it is provided that the device 100 has a second output 107, for example a binary signal output, wherein the method further comprises: outputting 206, on the basis of the comparison 202, an output signal OS at the second output 107, wherein, for example, the output signal OS is a binary signal.

Figure 14:
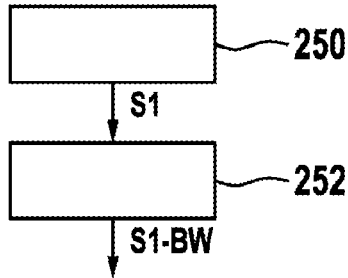
FIG. 14 schematically shows a simplified flowchart according to exemplary embodiments of the present invention.

Further exemplary embodiments, FIG. 14, relate to a method for operating an analog-to-digital converter device 1000, 1000a, 1000b comprising i, i>1, devices 100, N', P' according to the embodiments, wherein the i devices are in each case connectable in series and/or connected in series with respect to their first input and their first output in a series circuit SS such that a first output of a j-th device of the series circuit is connected to a first input of a j+1-th device of the series circuit, with j=1, 2, to i−1.

For example, the method is designed to operate an analog-to-digital converter device 1000a, 1000b according to the embodiments.

The method comprises: feeding 250 an input signal S1, for example in the form of an input current I_in for a first device of the series circuit; providing 252 a digital value, for example binary value, S1-BW, characterizing the input signal S1, for example the input current I_in, on the basis of an output current and/or an output signal of at least one, for example a plurality of, for example all, the i devices.

Figure 15:
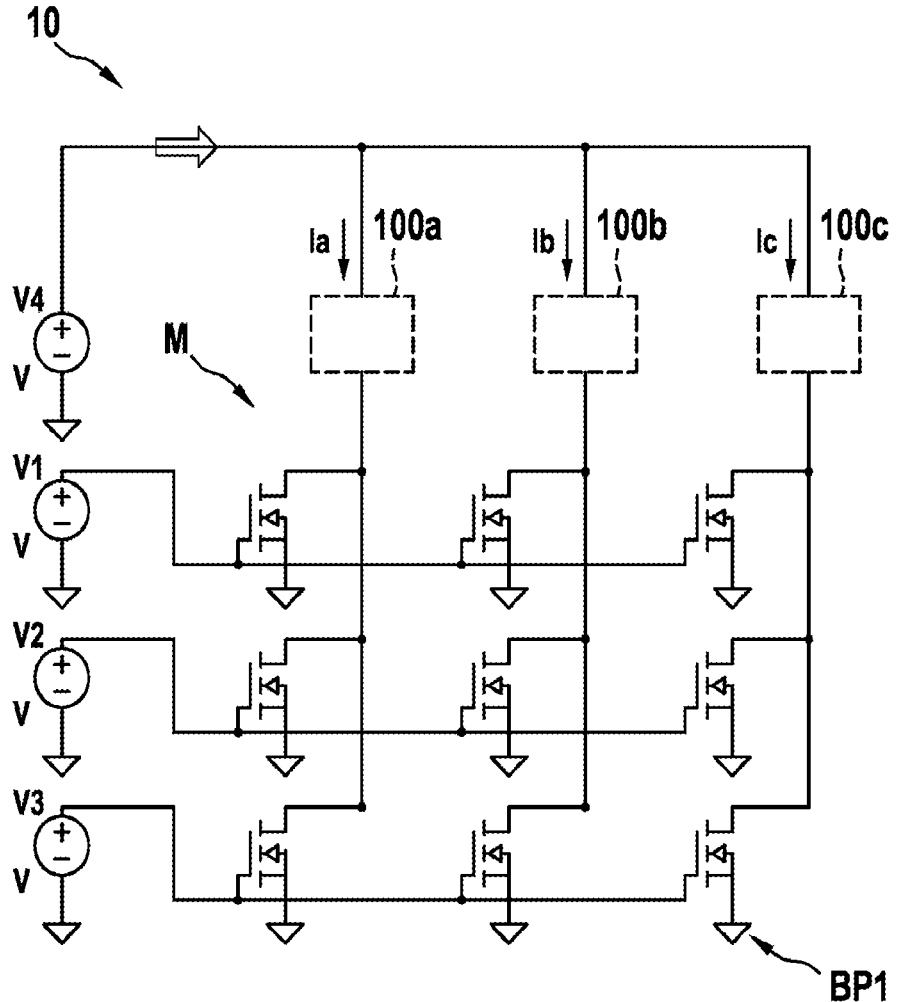
FIG. 15 schematically shows a simplified circuit diagram according to exemplary embodiments of the present invention.

Further exemplary embodiments, FIG. 15, relate to a computing device 10, for example for ascertaining a scalar product, for example a vector matrix multiplier, for example a dot product engine, comprising a matrix M of elements with a controllable electrical resistance (for example, memristors or ferroelectric field-effect transistors), and at least one analog-to-digital converter device 100a, 100b, 100c according to the embodiments. For example, the at least one analog-to-digital converter device 100a, 100b, 100c can be used according to exemplary embodiments for current measurement with respect to at least one column of the matrix M (cf. the currents Ia, Ib, Ic), in particular on a high side, i.e., in the range of a comparatively large electrical potential, for example of an operating voltage potential different from a ground potential BP1 (cf. the voltage source V4).

In further exemplary embodiments, the computing device 10 can be used, for example, for machine learning (ML) methods or for applications in the field of artificial intelligence, for example for hardware accelerators for training deep neural networks (DNN).

Figure 16:
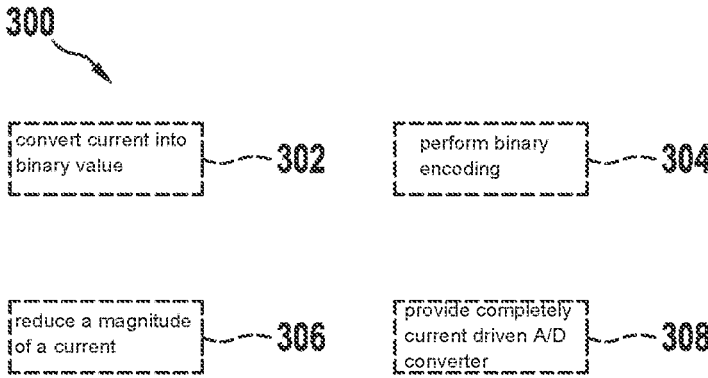
FIG. 16 schematically shows aspects of uses according to exemplary embodiments of the present invention.

Further exemplary embodiments, FIG. 16, relate to a use 300 of the device according to the embodiments and/or of the analog-to-digital converter device according to the embodiments and/or of the method according to the embodiments and/or of the computing device according to the embodiments for at least one of the following elements: a) converting 302 a current I_in into a binary value S1-BW, b) performing 304 a binary encoding, c) reducing 306 a magnitude of at least one current derivable on the basis of the input current, d) providing 308 a, for example completely, current-driven analog-to-digital converter 1000a, 1000b.

Below, further exemplary aspects according to further exemplary embodiments are described.

In further exemplary embodiments, the device according to the embodiments or an A/D converter device according to the embodiments has a comparatively low electrical power consumption, for example at least approximately corresponding to 0.5V*resolution in bits (number of stages or devices in the A/D converter device)*input current to be measured (or converted).

In further exemplary embodiments, the configuration 1000, 1000a, 1000b can be scaled, i.e., can, for example, be expanded by k-bit resolution by adding k stages or devices, k=1, 2, 3, . . . .

In further exemplary embodiments, approximately 12 field-effect transistors are used per bit resolution of the A/D converter device, plus possibly further elements, reusable in other stages or devices of the same and/or another A/D converter device, for generating a bias voltage.

In further exemplary embodiments, a binary encoding of the input current is performed.

In further exemplary embodiments, the device, for example the conversion device B1, B1' or the A/D converter device, comprises a temperature compensation.

In further exemplary embodiments, the conversion device B1, B1' enables precise and, for example, independent adjustment of the current values at which, for example, the states of the A/D converter device change.

In further exemplary embodiments, the conversion device B1, B1' or the control voltage generated thereby can be used in a plurality of A/D converter devices.

In further exemplary embodiments, the A/D converter device does not require any additional electrical power supply since it can be supplied, for example, by the input current.

In further exemplary embodiments, the A/D converter device is current-driven, for example completely current-driven, which is potentially faster in comparison with a voltage-controlled operation.

In further exemplary embodiments, the principle according to the embodiments makes it possible to construct an A/D converter device of compact design with comparatively few components or structural elements. For example, in further exemplary embodiments, an A/D converter device with an 8-bit resolution can be constructed by means of approximately 112 MOSFETs, which corresponds to less than approximately half a MOSFET per numerical step.

In further exemplary embodiments, the A/D converter device operates, for example completely, asynchronously, does not require a clock signal and/or iterations, and is therefore comparatively fast.

The invention claimed is:

1. A device, comprising:
a first input configured to receive an input current;
a second input configured to receive a reference current; and
a first output;
wherein the device is configured to compare the input current with the reference current, and, based on the comparison, to output an output current at the first output;
wherein the device is configured to ascertain whether the input current is less than a predeterminable integer n-fold of the reference current, and, based on the input current being less than the predeterminable integer n-fold of the reference current, to output the output current as a current which corresponds to an nth of the input current.

2. The device according to claim 1, wherein the device is configured, based on the input current being greater than or equal to n times the reference current, to output the output current as a current which corresponds to an nth of a difference between the input current and the reference current.

3. A device, comprising:
a first input configured to receive an input current;
a second input configured to receive a reference current; and
a first output;
wherein the device is configured to compare the input current with the reference current, and, based on the comparison, to output an output current at the first output;
wherein the device further comprises a second output; and
wherein the device is configured to output an output signal at the second output based on the comparison, wherein the output signal is a binary signal.

4. The device according to claim 3, wherein the device is configured to amplify the output current.

5. A device, comprising:
a first input configured to receive an input current;
a second input configured to receive a reference current; and
a first output;
wherein the device is configured to compare the input current with the reference current, and, based on the comparison, to output an output current at the first output; and
wherein the device further comprises at least one of the following elements: a) a conversion device configured to generate a bias voltage based on the reference current, b) a comparator device configured to compare the input current with the reference current and/or to compare a quantity characterizing the input current with a quantity characterizing the reference current, wherein the comparator device is configured to output an output signal based on the comparison, c) a current discharge device configured to at least temporarily discharge a current to a first reference potential, d) an inverter device configured to invert the output signal at least once, e) a first current output device configured to output a first current at the first output, at least temporarily, when the input current is less than the reference current, f) a second current output device configured to output a second current at the first output at least temporarily, when the input current is greater than the reference current.

6. A device, the device comprising:
a first input configured to receive an input current;
a second input configured to receive a reference current; and
a first output;
wherein the device is configured to compare the input current with the reference current, and, based on the comparison, to output an output current at the first output, and
wherein the device has a first polarity configuration, wherein the device of the first polarity configuration is configured to receive the input current as a current flowing from a first reference potential, and to output the output current to the first reference potential.

7. The device according to claim 6, wherein the device has a second polarity configuration, wherein the device of the second polarity configuration is configured to receive an input current flowing from a second reference potential, which is different from the first reference potential, and to output the output current to the second reference potential.

8. An analog-to-digital converter device, comprising i, i>1, devices, each device of the i devices including:
a first input configured to receive an input current,
a second input configured to receive a reference current, and
a first output,
wherein the device is configured to compare the input current with the reference current, and, based on the comparison, to output an output current at the first output;
wherein the i devices connectable in series and/or connected in series with respect to their first input and their first output in a series circuit such that the first output of a j-th device of the series circuit is connected to the first input a (j+1)-th device of the series circuit, with j=1, 2, to i−1.

9. The converter device according to claim 8, wherein each of the i devices can be fed in each case with a reference current, wherein an identical or a different reference current can be fed to at least some devices of the i devices.

10. The converter device according to claim 8, wherein each respective device of the i devices can be fed a reference current which corresponds to a position of the respective device in the series circuit, wherein a magnitude of the reference currents for devices adjacent in the series circuit differs by a predeterminable factor.

11. The converter device according to claim 8, wherein at least two successive devices of the i devices in the series circuit each case have a different polarity configuration, wherein a plurality of successive devices in the series circuit have an alternating polarity configuration, wherein the respective polarity configuration corresponds to a position of the respective device in the series circuit.

12. A method for operating a device including a first input configured to receive an input current, a second input configured to receive a reference current, and a first output, wherein the method comprises:
comparing the input current with the reference current; and
outputting an output current at the first output based on the comparison;

wherein the device has a second output, and wherein the method further comprises:

outputting, based on the comparison, an output signal at the second output, wherein the output signal is a binary signal.

13. A method for operating an analog-to-digital converter device including i, i>1, devices, each device of the i devices including a first input configured to receive an input current, a second input configured to receive a reference current, and a first output, wherein the i devices are connectable in series and/or connected in series with respect to their first input and their first output in a series circuit such that the first output of a j-th device of the series circuit is connected to the first input of a (j+1)-th device of the series circuit, with j=1, 2, to i−1, wherein the method comprises:

feeding an input signal in the form of an input current for a first device of the series circuit; and providing a digital value characterizing the input signal, based on an output current and/or an output signal of a plurality of the i devices.

14. A computing device configured to ascertain a scalar product, comprising:

a matrix of elements including a controllable electrical resistance; and at least one analog-to-digital converter device including:

i, i>1, devices, each device of the i devices including:

a first input configured to receive an input current;

a second input configured to receive a reference current; and a first output;

wherein the device is configured to compare the input current with the reference current, and, based on the comparison, to output an output current at the first output;

wherein the i devices connectable in series and/or connected in series with respect to their first input and their first output in a series circuit such that the first output of a j-th device of the series circuit is connected to the first input a (j+1)-th device of the series circuit, with j=1, 2, to i−1.

15. A device, comprising:

a first input configured to receive an input current;

a second input configured to receive a reference current; and a first output;

wherein the device is configured to compare the input current with the reference current, and, based on the comparison, to output an output current at the first output;

wherein the device is used for at least one of the following elements: a) converting a current into a binary value, b) performing a binary encoding, c) reducing a magnitude of at least one current derivable based on the input current, d) providing a completely, current-driven analog-to-digital converter.

16. The device according to claim 15, wherein the device is configured to ascertain whether the input current is less than the reference current, and, based on the input current being less than the reference current, to output the input current as the output current.

17. The device according to claim 16, wherein the device is configured to, based on the input current being greater than or equal to the reference current, to output the output current as a current which corresponds to a difference between the input current and the reference current.

* * * * *